(12) United States Patent
Hassan

(10) Patent No.: US 11,031,961 B2
(45) Date of Patent: Jun. 8, 2021

(54) SMART SYMBOL CHANGES FOR OPTIMIZATION OF COMMUNICATIONS USING ERROR CORRECTION

(71) Applicant: Microsoft Technology Licensing, LLC, Redmond, WA (US)

(72) Inventor: Amer Aref Hassan, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/512,709

(22) Filed: Jul. 16, 2019

(65) Prior Publication Data

US 2021/0021287 A1    Jan. 21, 2021

(51) Int. Cl.
*G06F 11/00*    (2006.01)
*H03M 13/00*   (2006.01)

(52) U.S. Cl.
CPC ....... *H03M 13/6588* (2013.01); *G06F 11/008* (2013.01); *H03M 13/6312* (2013.01)

(58) Field of Classification Search
CPC .......... H03M 13/6588; H03M 13/6312; G06F 11/008; H04L 27/3411; H04L 1/0058; H04L 27/2615; H04L 1/0042
USPC ...................................................... 714/746
See application file for complete search history.

(56) References Cited

U.S. PATENT DOCUMENTS

| 5,179,592 | A |  | 1/1993 | Kusano |  |
|---|---|---|---|---|---|
| 5,604,766 | A |  | 2/1997 | Dohi et al. |  |
| 5,944,851 | A | * | 8/1999 | Lee | H04N 19/00 714/799 |
| 6,134,274 | A |  | 10/2000 | Sankaranarayanan et al. |  |
| 6,158,041 | A |  | 12/2000 | Raleigh et al. |  |
| 6,421,357 | B1 |  | 7/2002 | Hall |  |
| 6,430,230 | B1 | * | 8/2002 | Cunningham | H04L 25/4908 375/292 |
| 6,757,299 | B1 |  | 6/2004 | Verma |  |

(Continued)

FOREIGN PATENT DOCUMENTS

| CN | 101681284 B | 1/2013 |
|---|---|---|
| EP | 1416659 A1 | 5/2004 |

(Continued)

OTHER PUBLICATIONS

"Application as Filed in U.S. Appl. No. 16/388,373", filed Apr. 18, 2019, 92 Pages.

(Continued)

*Primary Examiner* — Albert Decady
*Assistant Examiner* — Enam Ahmed
(74) *Attorney, Agent, or Firm* — Schwegman Lundberg & Woessner, P.A.

(57) ABSTRACT

Disclosed in some examples are methods, systems, devices, and machine-readable mediums which optimize one or more metrics of a communication system by intentionally changing symbols in a bitstream after encoding by an error correction coder, but prior to transmission. The symbols may be changed to meet a communication metric optimization goal, such as decreasing a high PAPR, reducing an error rate, reducing an average power level (to save battery), or altering some other communication metric. The symbol that is intentionally changed is then detected by the receiver as an error and corrected by the receiver utilizing the error correction coding.

20 Claims, 14 Drawing Sheets

(56) References Cited

U.S. PATENT DOCUMENTS

| | | |
|---|---|---|
| 6,934,317 B1 | 8/2005 | Dent |
| 7,032,238 B2 | 4/2006 | Parnell et al. |
| 7,113,708 B1 | 9/2006 | Creaney et al. |
| 7,139,322 B1 | 11/2006 | Nergis |
| 7,191,381 B2 | 3/2007 | Gesbert et al. |
| 7,215,721 B2 | 5/2007 | Hietala et al. |
| 7,292,639 B1 | 11/2007 | Demirekler et al. |
| 7,580,630 B2 | 8/2009 | Kee et al. |
| 7,599,338 B2 | 10/2009 | Sari |
| 7,647,037 B2 | 1/2010 | Ayachitula et al. |
| 7,668,248 B2 * | 2/2010 | Hocevar ............ H03M 13/616 375/260 |
| 7,768,934 B2 | 8/2010 | Yamanaka et al. |
| 7,792,200 B2 | 9/2010 | Molander |
| 7,986,783 B2 | 7/2011 | Ikushirna et al. |
| 8,059,697 B2 | 11/2011 | Dent |
| 8,155,175 B2 | 4/2012 | Olgaard |
| 8,189,407 B2 | 5/2012 | Strasser et al. |
| 8,189,711 B2 | 5/2012 | Shimizu |
| 8,270,525 B2 | 9/2012 | Nakagawa et al. |
| 8,401,102 B2 | 3/2013 | Tsouri et al. |
| 8,422,589 B2 | 4/2013 | Golitschek Edler Von Elbwart et al. |
| 8,446,811 B2 | 5/2013 | Yue et al. |
| 8,484,518 B2 | 7/2013 | Weeber |
| 8,494,087 B2 | 7/2013 | Seyedi-Esfahani |
| 8,509,259 B2 | 8/2013 | Powell |
| 8,559,378 B2 | 10/2013 | Schaepperle |
| 8,842,761 B2 | 9/2014 | Barsoum et al. |
| 9,071,306 B2 | 6/2015 | Kohda et al. |
| 9,094,151 B2 | 7/2015 | Perez De Aranda Alonso et al. |
| 9,176,810 B2 | 11/2015 | Peterson et al. |
| 9,276,680 B2 | 3/2016 | Valencia et al. |
| 9,386,587 B2 | 7/2016 | Hu et al. |
| 9,444,669 B2 | 9/2016 | Brecher et al. |
| 9,467,229 B2 | 10/2016 | Kai et al. |
| 9,608,733 B2 | 3/2017 | Pavlas et al. |
| 9,614,644 B2 | 4/2017 | Jeong et al. |
| 9,766,972 B2 | 9/2017 | Davis et al. |
| 9,792,176 B2 | 10/2017 | Blaichman et al. |
| 9,806,739 B1 | 10/2017 | Kojima et al. |
| 9,818,136 B1 | 11/2017 | Hoffberg |
| 9,859,977 B2 | 1/2018 | Zhao et al. |
| 10,014,905 B2 * | 7/2018 | Dang et al. ............ H04L 1/0071 |
| 10,015,028 B2 | 7/2018 | Jorgensen et al. |
| 10,084,631 B2 | 9/2018 | Raphaeli et al. |
| 10,230,468 B2 | 3/2019 | Mansouri Rad et al. |
| 10,333,617 B2 | 6/2019 | Moision et al. |
| 10,333,622 B2 | 6/2019 | Bhoja et al. |
| 10,686,530 B1 | 6/2020 | Hassan |
| 2002/0016945 A1 * | 2/2002 | Sayood ............ H03M 13/6312 714/779 |
| 2003/0076569 A1 | 4/2003 | Stevens |
| 2003/0099302 A1 | 5/2003 | Tong et al. |
| 2004/0123224 A1 | 6/2004 | Colombo et al. |
| 2005/0047517 A1 | 3/2005 | Georgios et al. |
| 2005/0157780 A1 * | 7/2005 | Werner ............ H04L 25/03057 375/232 |
| 2005/0185725 A1 * | 8/2005 | Maeda ................ H04L 27/261 375/260 |
| 2005/0207754 A1 | 9/2005 | Yamaguchi et al. |
| 2006/0098747 A1 | 5/2006 | Yue et al. |
| 2006/0126573 A1 * | 6/2006 | Dick .................... H04B 7/2628 370/335 |
| 2006/0203765 A1 | 9/2006 | Laroia et al. |
| 2007/0014286 A1 | 1/2007 | Lai |
| 2007/0093094 A1 | 5/2007 | Yue et al. |
| 2007/0195589 A1 | 8/2007 | Hidaka |
| 2008/0055979 A1 | 3/2008 | Shim |
| 2008/0082736 A1 | 4/2008 | Chow et al. |
| 2008/0299984 A1 | 12/2008 | Shimomura et al. |
| 2009/0022241 A1 | 1/2009 | Fukuoka et al. |
| 2009/0080556 A1 | 3/2009 | Duan et al. |
| 2009/0092072 A1 | 4/2009 | Imamura et al. |
| 2009/0148058 A1 | 6/2009 | Dane et al. |
| 2009/0300460 A1 | 12/2009 | Yoshii et al. |
| 2009/0313519 A1 | 12/2009 | Nagaraja |
| 2010/0008214 A1 | 1/2010 | Siaud et al. |
| 2010/0034186 A1 | 2/2010 | Zhou et al. |
| 2010/0050050 A1 * | 2/2010 | Nishi ................ H03M 13/6362 714/758 |
| 2010/0182294 A1 | 7/2010 | Roshan et al. |
| 2010/0223530 A1 | 9/2010 | Son et al. |
| 2010/0226449 A1 | 9/2010 | Ilow et al. |
| 2010/0293440 A1 | 11/2010 | Thatcher et al. |
| 2010/0303004 A1 | 12/2010 | Mueck et al. |
| 2010/0329401 A1 * | 12/2010 | Terry .................... H04L 27/264 375/346 |
| 2011/0029845 A1 | 2/2011 | Zhou et al. |
| 2011/0066902 A1 | 3/2011 | Sharon et al. |
| 2011/0131468 A1 * | 6/2011 | Myers ................ H04J 13/0029 714/758 |
| 2012/0060069 A1 | 3/2012 | Yu et al. |
| 2012/0128367 A1 | 5/2012 | Yamada |
| 2012/0155354 A1 | 6/2012 | Kishigami et al. |
| 2013/0202001 A1 | 8/2013 | Zhang |
| 2013/0238955 A1 | 9/2013 | D'abreu et al. |
| 2013/0343473 A1 | 12/2013 | Eliaz et al. |
| 2014/0043069 A1 | 2/2014 | Oh et al. |
| 2014/0072068 A1 | 3/2014 | Zhu et al. |
| 2014/0086575 A1 | 3/2014 | Fukushi |
| 2014/0334421 A1 | 11/2014 | Sosa et al. |
| 2014/0362934 A1 | 12/2014 | Kumar |
| 2014/0376663 A1 | 12/2014 | Ko et al. |
| 2015/0049844 A1 | 2/2015 | Stott |
| 2015/0085748 A1 | 3/2015 | Jorgensen et al. |
| 2015/0092881 A1 | 4/2015 | Hwang et al. |
| 2015/0117227 A1 | 4/2015 | Zhang et al. |
| 2015/0117433 A1 | 4/2015 | Zhang et al. |
| 2015/0193302 A1 | 7/2015 | Hyun et al. |
| 2015/0205664 A1 | 7/2015 | Janik et al. |
| 2016/0028514 A1 | 1/2016 | Venkataraghavan et al. |
| 2016/0042797 A1 | 2/2016 | Kim |
| 2016/0127091 A1 | 5/2016 | Yan et al. |
| 2016/0239796 A1 | 8/2016 | Grant et al. |
| 2016/0241682 A1 | 8/2016 | Xu et al. |
| 2016/0315733 A1 | 10/2016 | Murakami et al. |
| 2016/0350187 A1 | 12/2016 | Saliba |
| 2017/0063466 A1 | 3/2017 | Wang et al. |
| 2017/0141798 A1 | 5/2017 | Kudekar et al. |
| 2017/0180055 A1 | 6/2017 | Yu et al. |
| 2018/0103382 A1 | 4/2018 | Hassan et al. |
| 2018/0123840 A1 | 5/2018 | Dmitriev-zdorov |
| 2018/0183516 A1 | 6/2018 | Moision et al. |
| 2018/0337816 A1 | 11/2018 | Herath et al. |
| 2019/0052505 A1 | 2/2019 | Baldemair et al. |
| 2019/0121417 A1 | 4/2019 | Schneider et al. |
| 2019/0149265 A1 | 5/2019 | Das Sharma |
| 2019/0214852 A1 | 7/2019 | Park |
| 2019/0260394 A1 | 8/2019 | Motwani et al. |
| 2019/0312694 A1 | 10/2019 | Jia et al. |
| 2020/0186189 A1 * | 6/2020 | Herath .................... H04L 1/203 |

FOREIGN PATENT DOCUMENTS

| | | |
|---|---|---|
| JP | 2009535924 A | 10/2009 |
| JP | 2011135161 A | 7/2011 |
| KR | 20140037313 A | 3/2014 |
| WO | 0228041 A3 | 10/2002 |
| WO | 2007066973 A2 | 6/2007 |
| WO | 2008046163 A1 | 4/2008 |
| WO | 2008095334 A1 | 8/2008 |
| WO | 2009003278 A1 | 1/2009 |
| WO | 2013086311 A1 | 6/2013 |
| WO | 2019047162 A1 | 3/2019 |

OTHER PUBLICATIONS

"Ex-Parte Quayle Action Issued in U.S. Appl. No. 16/513,101", Mailed Date: Mar. 6, 2020, 06 Pages.

"Notice of Allowance Issued in U.S. Appl. No. 16/526,496", dated Mar. 30, 2020, 11 Pages.

(56) References Cited

OTHER PUBLICATIONS

Ali, et al., "Peak-to-Average Power Ratio Reduction Using N-tuple Selective Mapping Method for MC-CDMA", In Journal of ETRI, vol. 37, Issue 2, Apr. 2, 2015, pp. 338-347.

Dash, et al., "Constellation Modulation—An Approach to Increase Spectral Efficiency", In Journal of Optics Express, vol. 25, Issue 14, Jul. 10, 2017, 22 Pages.

Feng, et al., "Digital Domain Power Division Multiplexing DDO-OFDM Transmission with Successive Interference Cancellation", In Proceedings of Conference on Lasers and Electro-Optics, Jun. 5, 2016, 2 Pages.

Sharma, et al., "Bit Error Rate Improvement by using Active Constellation Extension and Neural Network in OFDM System", In Journal of Network Communications and Emerging Technologies, vol. 6, Issue 3, Mar. 2016, pp. 33-36.

Taher, et al., "Reducing the PAPR of OFDM Systems by Random Variable Transformation", In Journal of ETRI, vol. 35, Issue 4, Aug. 30, 2013, pp. 714-717.

Wu, et al., "A New Constellation Diagram-Based Signal Detection for GSM-MIMO Systems", In Journal of IEEE Communications Letters, vol. 22, Issue 3, Mar. 2018, pp. 502-505.

Wu, et al., "Digital Domain Power Division Multiplexed Dual Polarization Coherent Optical OFDM Transmission", In Journal of Scientific Reports, vol. 8, No. 1, Oct. 25, 2018, 8 Pages.

"Non Final Office Action Issued in U.S. Appl. No. 16/512,668", dated May 18, 2020, 8 Pages.

"Non Final Office Action issued in U.S. Appl. No. 16/512,738", dated Nov. 10, 2020, 40 Pages.

Wang, et al., "Low-complexity Peak-to-average Power Ratio Reduction Method for Orthogonal Frequency-division Multiplexing Communications", In Journal of IET Communications, vol. 9, Issue 17, Nov. 26, 2015, 7 Pages.

"Non Final Office Action Issued in U.S. Appl. No. 16/512,786", dated Aug. 6, 2020, 6 Pages.

"Non Final Office Action Issued in U.S. Appl. No. 16/512,802", dated Jun. 26, 2020, 11 Pages.

"Notice of Allowance Issued in U.S. Appl. No. 16/526,496", dated Jul. 14, 2020, 7 Pages.

"International Search Report and Written Opinion Issued in PCT Application No. PCT/US20/036867", dated Oct. 7, 2020, 10 Pages.

"Non Final Office Action Issued in U.S. Appl. No. 16/513,159", dated Oct. 29, 2020, 12 Pages.

Urban, et al., "OFDM PAPR Reduction by Combination of Interleaving with Repeated Clipping and Filtering", In Proceedings of the 17th International Conference Radioelektronika, Jun. 1, 2007, pp. 249-252.

Jamieson, et al., "SPCpl-04: Bit Mapping and Error Insertion for FEC Based PAPR Reduction in OFDM Signals", In IEEE Globecom, Nov. 1, 2007, 5 Pages.

Liu, et al., "Deliberate Bit Flipping With Error-Correction for PAPR Reduction", In IEEE Transactions on Broadcasting vol. 63, Issue 1, Mar. 1, 2017, pp. 123-133.

"International Search Report & Written Opinion issued in PCT Application No. PCT/US2020/033888", dated Jul. 31, 2020, 12 Pages.

"International Search Report and Written Opinion Issued in PCT Application No. PCT/US2020/033014", dated Aug. 18, 2020, 13 Pages.

"International Search Report and Written Opinion Issued in PCT Application No. PCT/US2020/033348", dated Aug. 24, 2020, 13 Pages.

"International Search Report and Written Opinion Issued in PCT Application No. PCT/US2020/033501", dated Aug. 25, 2020, 12 Pages.

"International Search Report and Written Opinion Issued in PCT Application No. PCT/US2020/034586", dated Sep. 8, 2020, 13 Pages.

"International Search Report and Written Opinion Issued in PCT Application No. PCT/US2020/033012", dated Aug. 20, 2020, 12 Pages.

"International Search Report and Written Opinion Issued in PCT Application No. PCT/US2020/033503", dated Aug. 18, 2020, 12 Pages.

"Final Office Action Issued in U.S. Appl. No. 16/512,668", dated Aug. 28, 2020, 9 Pages.

"Notice of Allowance Issued in U.S. Appl. No. 16/512,738", dated Mar. 16, 2021, 19 Pages.

Alkady, et al., "Peak-to-Average Power Ratio Reduction using Adaptive Subcarrier Phase Adjustment Algorithm for OFDM-based Cognitive Radio", In Proceedings of the Wireless Personal Communications, vol. 80, issue 4, Feb., 2015, pp. 1535-1546.

* cited by examiner

SMART SYMBOL CHANGES FOR OPTIMIZATION OF COMMUNICATIONS USING ERROR CORRECTION

BACKGROUND

Modern communication systems, such as fiber optic communications, Radio Frequency (RF) communications, and the like frequently utilize Error Correction Codes (ECC) to encode data for transmission. These ECC are able to detect, and in some examples, correct errors in communications. For example, Forward Error Correction (FEC) codes are able to correct a limited number of erroneously received symbols without the receiver needing to request a retransmission.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
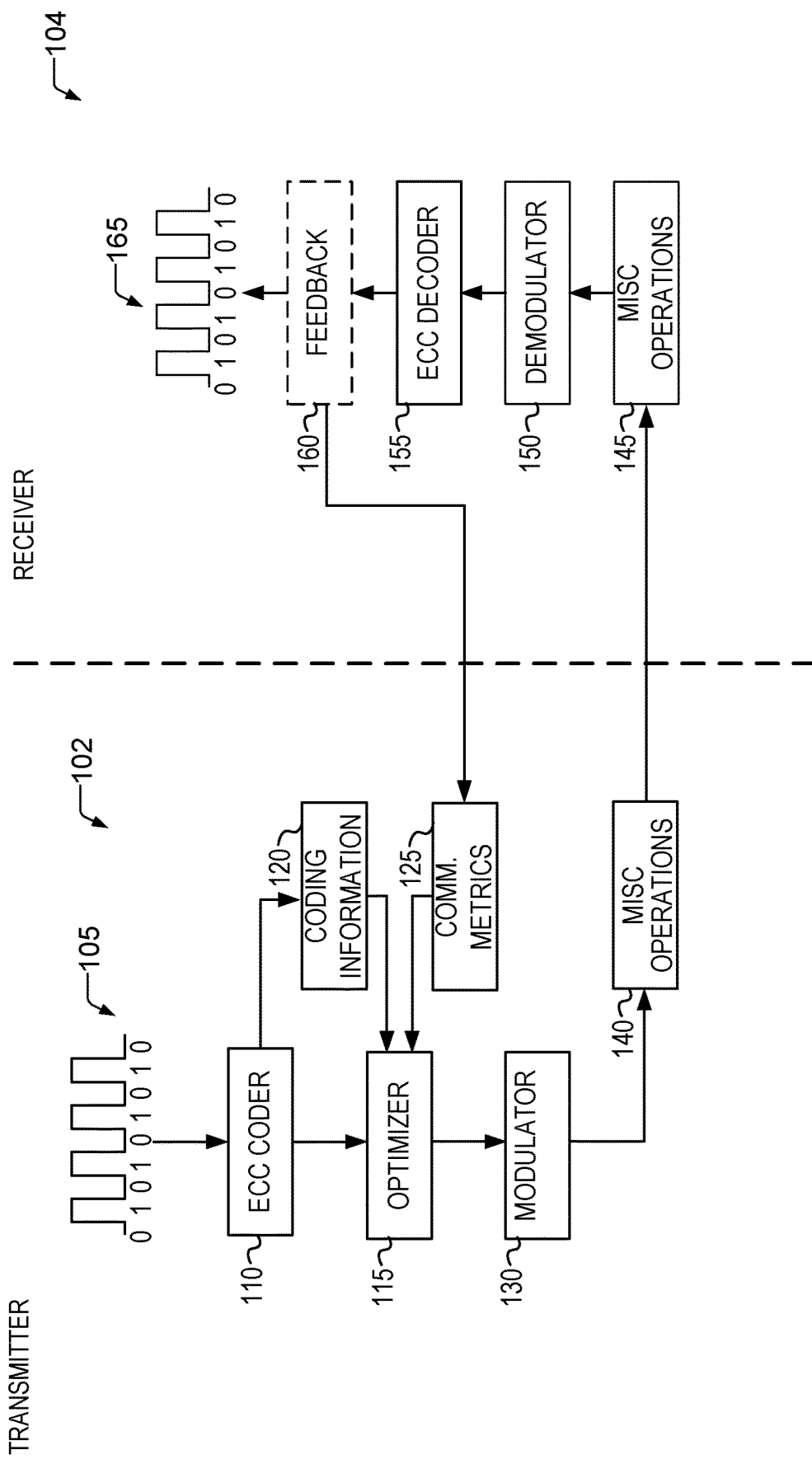
FIG. 1 illustrates an example transmitter and receiver according to some examples of the present disclosure.

Modern communication systems sometimes suffer from high Peak-to-Average Power ratios (PAPR). Transmissions with large PAPR introduce distortion causing bit error and out-of-band interference when the signal is amplified. Example communication systems that have a tendency to suffer from high PAPR include those that utilize Orthogonal Frequency Division Multiplexing (OFDM) such as 4G Long Term Evolution (LTE) networks, 5G mobile networks, and some networks based upon the Institute of Electrical and Electronics Engineers (IEEE) 802.11 family of standards. One present technique for reducing high PAPR is clipping—which removes the high amplitude part of the signal that is outside a particular range. Clipping, while reducing PAPR also causes undesired side effects such as distortion and adjacent channel interference. Another solution proposed is to carefully select the codewords used to modulate the signal onto the carrier. This requires large computations and/or storage of large lookup tables.

Modern communication systems face other problems instead of, or in addition to high PAPR, including high bit-error rates in noisy environments. For example, a channel that has poor conditions (e.g., a low received signal strength, a channel with large amounts of interference, etc.) may have a corresponding high error rate when paired with high-bandwidth modulation schemes. The current solutions to this problem force the communication system to reduce bandwidth to lower error rate. The transmitter may downgrade to a lower modulation scheme that is more error tolerant, but also sends fewer bits. For example, a transmitter utilizing a Quadrature Amplitude Modulation (QAM) scheme may prefer to utilize QAM256 which allows for eight data bits to be transmitted per transmission symbol. If the channel is noisy, the transmitter may reduce the coding from QAM256 to a lower QAM level such as QAM64 where each symbol maps to six data bits. Because each symbol in QAM64 is further apart in amplitude and phase as compared to QAM256, it is easier for the receiver to decode in noisy environments (and thus lowers the error rate). However, dropping from QAM256 to QAM64 reduces the channel bandwidth and slows down the user experience.

While the above problems have been discussed with respect to radio frequency communications, high PAPR and bit error rate are also applicable to other communication types. For example, optical communications, such as communication through fiber optics may also use similar modulation schemes. Optical communications may encode a digital bitstream into light pulses or beams through many of the same techniques RF systems modulate data onto radio waves. For example, optical communications may utilize QAM and other techniques.

In some examples, issues such as high PAPR may be caused by a compression applied to the data stream that may be applied before or with modulation. For example, power-based compression may transmit repeated values in the input data stream by transmitting a single bit of the value, but at a power level that is correlated (e.g., positively correlated) with the number of repeated values in the data stream. Thus, a single '1' may be transmitted at a (peak, or average—depending on the modulation scheme) power level of P1, a value of '1 1' may be transmitted at P2 (where P2 is different than P1), a value of '1 1 1' is transmitted at P3 (where P3 is different than P2 and P1), and so on. This technique may cause high PAPR if there is a very large sequence of the repeated value or if there are relatively few repeated bit sequences.

Disclosed in some examples are methods, systems, devices, and machine-readable mediums which optimize one or more metrics of a communication system by intentionally changing symbols in a bitstream after encoding by an error correction coder, but prior to transmission. The symbols may be changed to meet a communication metric optimization goal, such as decreasing a high PAPR, reducing an error rate, reducing an average power level (to save battery), or altering some other communication metric. For example, a symbol that would be transmitted at a high-power level may be changed to a symbol that is transmitted at a lower power level. The symbol that is intentionally changed is then detected by the receiver as an error and corrected by the receiver utilizing the error correction coding. The system thus intentionally introduces errors into the transmission in order to optimize a desired communication metric. The present disclosure thus uses a technical solution—utilizing extra ECC correction capacity to solve the technical problems of improving communication metrics such as PAPR. This solution avoids the drawbacks present in previous solutions such as clipping or downgrading the modulation scheme (which reduces bandwidth).

A symbol, as used herein, is either the one or more bits that are converted to a transmission symbol by modulation (or other processes) or the transmission symbol itself. For example, a symbol may be one or more bits of a received bitstream that would be mapped to a single transmission unit by a modulation scheme or the result of modulating the one or more bits of the received bitstream (e.g., a waveform, a state, or other property of the communication channel that persists for a specified period of time). For example, a QAM16 modulation scheme represents up to four bits per transmission symbol. The actual transmission symbol is described by the combined properties of a carrier phase shift and amplitude. As used herein the symbol refers to the four bits that make up the symbol as well as the phase shift and amplitude that represents those bits.

For optical communication networks with a simple modulation scheme where a light source activates to encode the bits of the bitstream (e.g., "on" represents a '1' and off represents a '0') and where the power level represents additional repeating bits (e.g., "on" with power level 1 is '1' and "on" with power level 2 is '1 1'), the symbol may be either the bits represented by the light source activation and power level or the indication of whether the light source is activated and at the power level it is activated. Thus, the symbol may be a sequence of one or more bits or the activation and/or amplitude of the light source.

Thus, it is contemplated that the symbols may be changed prior to modulation—e.g., as a sequence of one or more bits, or after modulation—when they are described by properties of the communication medium such as a waveform and/or amplitude. For ease of description, the specification will refer to a symbol as a sequence of one or more bits, but it is to be understood that the modulated representation of the sequence of one or more bits is also within the scope of the present disclosure In some examples, where the communication metric optimization goal is to reduce a PAPR, symbols which produce high transmission powers when transmitted may be changed to symbols that produce lower transmission powers when transmitted. This reduces high PAPR by reducing transmissions that occur at peak transmission power. The changed symbols are then corrected by the receiver using the ECC. In some examples, the symbols which produce a maximum reduction of a PAPR may be selected and changed. In other examples, symbols which produce a reduction over a threshold value may be selected and changed.

In some examples, where the communication metric optimization goal is to reduce bit errors, symbols of the bitstream may be selected that have adjacent symbols such that the selected symbols and one or more adjacent symbols map to constellation points close to each other (e.g., within a threshold distance) on the constellation map. The selected symbols may be changed such that the selected symbol maps to constellation points that are farther away from their respective adjacent symbols. This makes it easier for the receiver to discriminate between adjacent symbols and thus decreases an overall bit-error rate while maintaining the overall data rate. While this might seem counter-intuitive (increasing an error rate to reduce it), consider an example in which three adjacently transmitted symbols are all close together on the constellation map. In a noisy environment, all three symbols may be erroneously received. By changing one or two of these symbols to symbols that are not close to the other remaining symbols (or each other), the possibility of correctly receiving at least one of the three symbols may be increased. Furthermore, these changed symbols are corrected by the receiver using ECC.

One or more symbols may be changed over a specified transmission window (e.g., a time period where a number of symbols are transmitted). A maximum number of symbols that may be changed may be the number of symbols that are correctable via the ECC used over the transmission window. For example, if the ECC can correct 10 symbols for every 128 symbols, then the system may intentionally change 10 symbols to lower PAPR or lower error rate, or the like. This approach may lead to increased bit error rate if the channel experiences any natural errors. This is because any natural errors thus exceed the ECC's ability to correct the combination of naturally occurring errors and intentionally added errors. These errors may be termed uncorrectable errors which may require a retransmission of the data.

To avoid uncorrectable errors and an increase in error rate, the system may utilize less than the maximum number of symbols correctable for the transmission window. The system may utilize a buffer for allowing natural channel errors by intentionally changing fewer symbols than the ECC can correct for. For example, if the ECC can correct 10 symbols for every 128 symbols transmitted, the system may utilize a one symbol buffer, and so the system may change only nine symbols.

In other examples, the system may determine one or more communication metrics (that may or may not be the communication metrics that are being optimized by the optimization goals), such as a past error rate (e.g., a bit error rate, a number of past symbols corrected during a transmission window, or the like), a received signal strength (RSSI), a signal quality, or the like. The system may calculate a number of expected symbol errors for a current transmission window based upon one or more of these communication metrics and may intentionally change a number of symbols that is based on the difference between the maximum number of symbols that may be changed and the number of expected symbol errors. For example, a number of symbols to be changed may be:

number of symbols to change=max−(expected errors+$c$)

Where max is the maximum number of symbols that can be changed based upon the ECC used, expected errors is the number of symbols that are expected to be received in error that are not intentionally changed by the transmitter given the current communication metrics, and c is a padding value to ensure that bit error rate is not increased. In some examples, c may be zero.

The communication metrics used may be communication metrics for one or more past transmission time periods or may be for one or more past transmissions in a current time period. Calculating the expected number of symbol errors given the communication metrics may involve one or more machine learning algorithms where models are trained using past communication metrics and labeled with past symbol errors occurring that correspond to those communication metrics. The models predict, given the present communication metrics, the expected number of symbol errors. More information on the machine-learning aspects are disclosed with respect to FIG. 13 and the later discussion of FIG. 13.

In other examples, simple correlations between one or more communication metrics may be utilized. For example, various ranges of RSSI for the recipient device may be expected to have certain corresponding error rates. Similarly, past error rates may be predictive of future error rates if the transmitter and receiver are stationary (such as with a pair of Internet of Things devices). In these use cases, the number of symbols that have errors may be relatively constant and predictable. In these examples the communication metrics may simply be an average symbol error rate for past particular transmission windows. And the expected errors may simply be the average symbol error rate.

In still other examples, the system may learn the average error rate for a particular time of day, a particular day of the week, and the like and may utilize the average error rate in view of the current time of day, particular day of the week, and/or the like to determine the expected number of symbol errors given the average error rate for the particular time of day, a particular day of the week, and the like. In some examples, the expected errors may simply be the average symbol error rate for the particular time of day, a particular day of the week, and the like.

As noted, symbols may be changed to achieve a specified communication metric optimization goal. In some examples, the symbols may be selected to maximize the achievement of the stated communication metric optimization goal. For example, if the number of symbols to change is x, and the objective is to lower PAPR, then the x symbols with the highest transmission powers in a transmission window may be changed to symbols with lower transmission powers. In some examples, instead of just changing the top x symbols with the highest transmission powers, the system may seek to remove large spikes in transmission powers. For example if x is one, and the power levels of respective symbols is: {P1, P2, P2, P6, P2, P1, P2, P3, P4, P4, P5, P6, P7, P6, P5}, where P1<P2<P3<P4<P5<P6<P7, the system may remove the P6 at the fourth symbol as it has a large transmission power jump between successive surrounding symbols (which are transmitted at P2). This may help to provide a more linear transmission and prevent wear on the transmitter.

In another example, the symbols may be selected so as to minimize an error rate, such as a bit-error rate. For example, if the number of symbols that are changed is x, and the objective is to lower bit error rate, then each particular one of x symbols that each have one or more neighboring symbols that map to constellation points that are close (on the constellation chart) to the constellation point of the particular symbol may be changed to symbols that map to points that are further apart. In some examples, closeness may be measured by a distance, or may be determined by a mapping table that specifies a distance between constellation points. In other examples, the system may keep track of error rates for each symbol (e.g., through feedback from the receiver) and may select and change symbols with a high historical error rate.

In some examples, multiple communication metric optimization goals may be pursued at the same time. For example, both a PAPR and a bit-error rate may be lowered. That is, if a symbol sequence of [S1, S2, S3] is examined, and S1, S2, and S3 map to constellation points that are very close to each other, then the symbol with the highest peak power level may be selected to be changed. That is, both reduction in bit error and PAPR may be factors in deciding which symbols to change. Thus, achieving an optimization goal related to a first communication metric may be used to select a first group of symbols and achieving a second optimization goal related to a second communication metric may then be used to select a symbol within that group.

The presently disclosed techniques may be applied to various communication protocols and transmission mediums. For example, optical communications, RF communications, and the like. The present techniques may also be utilized to achieve many different communication metric optimization goals, such as reduction in PAPR, reduce error rate (e.g., a bit-error rate), or the like. Additionally, as used herein, symbol values are changed. However, in other examples, the symbols are punctured (removed) from the bitstream so as not to transmit them at all. This may be beneficial as some ECC schemes can correct more missing data than incorrect data. In yet other examples, some symbols may be removed, some symbols may be changed to achieve a maximum reduction in PAPR and/or error rate.

Turning now to FIG. 1, an example transmitter 102 and receiver 104 are illustrated according to some examples of the present disclosure. Bitstream 105 may be received from higher networking layers (e.g., applications) or other components that are not shown. ECC coder 110 may apply an ECC to the bitstream such as a forward error correction code. Example ECC may include block codes (e.g., Hamming codes), cyclic codes, BCH (Bose-Chaudhri-Hocquenghem) codes, Reed-Solomon codes, Convolutional codes (including Viterbi codes), and the like.

An optimizer 115 may modify one or more symbols of the coded bitstream. For example, the optimizer 115 may seek to optimize one or more communication metric optimization goals such as a PAPR and/or an error rate by modifying one or more bits or symbols of the coded bitstream. Optimizer 115 may utilize information about the ECC applied by ECC coder 110, and communication metrics 125 of the communication medium to determine how many symbols may be changed. For example, the optimizer 115 may optimize more than one symbol and may determine, using the coding information 120 and communication metrics 125 how many symbols to change. Coding information 120 may be the type of code applied, the number of symbols for each transmission window that can be corrected, and the like. For example, the optimizer 115 may utilize the formula:

number of symbols to change=max−(expected errors+c)

Where max is the maximum number of symbols that can be changed based upon the ECC used, expected errors is the number of symbols that are expected to be received in error by the receiver that are not intentionally changed by the transmitter given the current communication metrics, and c is a padding value to ensure that bit error rate is not increased. In some examples, c may be zero After the symbols are changed, the modulator 130 applies a modulation scheme, such as a pulse modulation, an orthogonal frequency division multiplexing (OFDM), a Quadrature Amplitude Modulation, or the like. As shown, optimizer 115 changes the symbols prior to modulation, but in other examples, the symbols may be changed by optimizer 115 after modulation. Thus, optimizer 115 may be after the modulator 130. Once the bits are modulated, miscellaneous operations component 140 may perform miscellaneous operations to prepare for transmission, such as amplification, clipping, or the like before it is transmitted across the communication medium.

Receiver 104 receives the transmitted symbols and miscellaneous operations component 145 may perform miscellaneous operations such as equalization, synchronization, and the like. Demodulator 150 may demodulate the symbols by applying a detection process for the modulated symbols according to the modulation scheme. ECC decoder 155 may find and correct errors by applying an appropriate decoding algorithm corresponding to the ECC algorithm applied by ECC coder 110. The decoded symbols may be checked for errors, and any errors found may be corrected by the ECC decoder 155. Any errors intentionally introduced by optimizer 115 may be corrected by ECC decoder 155. Feedback component 160 may monitor, measure, or determine various parameters of the communication medium. Feedback component 160 may provide one or more communication metrics 125 to the transmitter. Communication metrics 125 may include a received signal strength, an error rate, a quality metric, or the like. The output bitstream 165 is then passed to other components of the receiver that are not shown for clarity.

Figure 2:
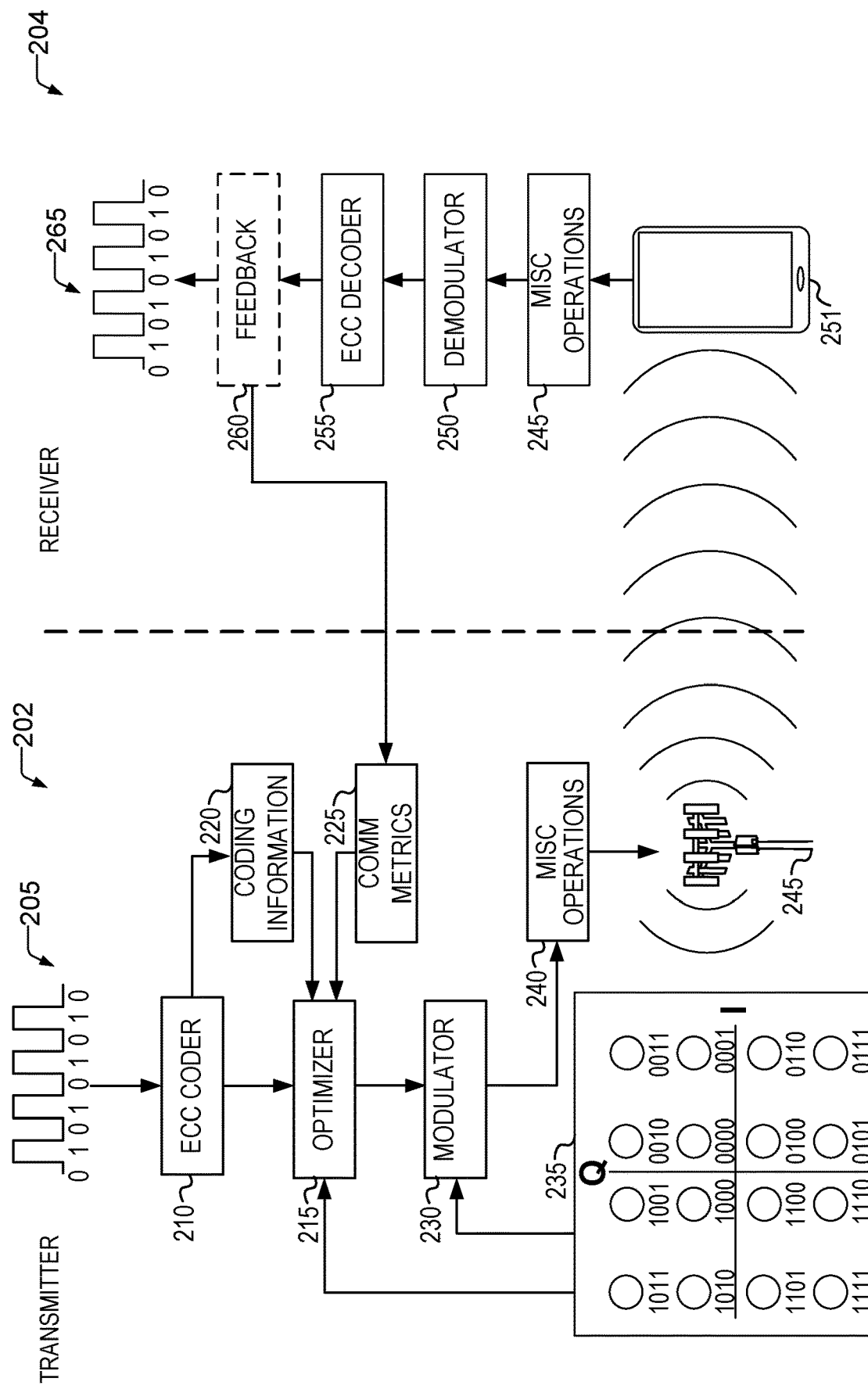
FIG. 2 illustrates an example RF transmitter and receiver according to some examples of the present disclosure.

FIG. 2 illustrates an example RF transmitter 202 and receiver 204 according to some examples of the present disclosure. Bitstream 205 may be received from higher networking layers or other components that are not shown. ECC Coder 210 may apply an ECC to the bitstream 205 such as a forward error correction code. Example ECC may include block codes (e.g., Hamming codes), cyclic codes, BCH (Bose-Chaudhri-Hocquenghem) codes, Reed-Solomon codes, Convolutional codes (including Viterbi codes), and the like.

An optimizer 215 may modify one or more symbols of the coded bitstream. For example, the optimizer 215 may seek to optimize one or more wireless parameters such as a PAPR and/or a bit error rate by modifying one or more bits or symbols of the coded bitstream. Optimizer 215 may utilize information about the codes applied by ECC coder 210 (coding information 220), and communication metrics 225 of the communication medium to determine how many symbols may be changed. For example, the optimizer 215 may optimize more than one symbol and may determine, using the coding information 220 and communication metrics 225 how many symbols to change. Coding information 220 may be the type of code applied, the number of symbols for each transmission window that can be corrected, and the like. For example, the optimizer 215 may utilize the formula:

number of symbols to change=max−(expected errors+c)

Where max is the maximum number of symbols that can be changed based upon the ECC used, expected errors is the number of symbols that are expected to be received in error by the receiver that are not intentionally changed by the transmitter given the current communication metrics, and c is a padding value to ensure that bit error rate is not increased. In some examples, c may be zero. In some examples, the optimizer 215 may be one example of optimizer 115.

After the symbols are changed, the modulator 230 applies a radio frequency modulation scheme, such as a pulse modulation, an orthogonal frequency division multiplexing (OFDM), a Quadrature Amplitude Modulation (QAM), or the like. For example, the modulator 230 may apply a QAM modulation scheme, which may have an associated constellation diagram 235. The constellation diagram 235 shows an example QAM16 constellation diagram 235 with a plurality of constellation points representing a phase of the carrier and an amplitude for each given bit combination. As shown, optimizer 215 changes the symbols prior to modulation, but in other examples, the symbols may be changed by optimizer after the modulator 230.

Once the bits are modulated, miscellaneous operations component 240 may perform miscellaneous operations, such as amplification, clipping, or the like before it is transmitted across the communication medium. The signals may be transmitted using radio frequency waves at antenna 245. The transmitter 202 may be a base station (e.g., a cellular base station operating according to a Long-Term Evolution (LTE), LTE-Advanced, or a 5G New Radio standard), an access point (e.g., an access point operating according to an 802.11 family of standards, such as 802.11ax) or another computing device (e.g., peer-to-peer transmitter). In some examples, the transmitter 202, ECC coder 210, coding information 220, optimizer 215, communication metrics 225, modulator 230 and miscellaneous operations component 240 may be examples of transmitter 102, ECC coder 110, coding information 120, optimizer 115, communication metrics 125, modulator 130 and miscellaneous operations component 140 of FIG. 1.

Receiver 204, in the form of a mobile computing device 251 receives the transmitted symbols and miscellaneous operations component 240 may perform miscellaneous operations such as equalization, synchronization, and the like. It will be appreciated by a person of ordinary skill in the art with the benefit of this disclosure that other computing devices may be used as receiver 204 and that a mobile device is just an example device. Demodulator 250 may demodulate the symbols by applying a detection process for the modulated symbols according to the modulation scheme. ECC Decoder 255 may find and correct errors by applying an appropriate decoding algorithm corresponding to the ECC algorithm applied by ECC coder 210. The decoded symbols may be checked for errors, and any errors may be corrected by utilizing the ECC decoder 255. Errors intentionally introduced by optimizer 215 in changing the symbols transmitted may also be corrected by the ECC decoder 255. Feedback component 260 may monitor, measure, or determine various parameters of the communication medium. Feedback component 260 may provide one or more communication metrics 225 to the transmitter. Communication metrics 225 may include a received signal strength, an error rate, a quality metric, or the like.

The output bitstream 265 is then passed to other components of the receiver that are not shown for clarity. In some examples, the miscellaneous operations component 240, demodulator 250, ECC decoder 255, and feedback component 260 may be examples of miscellaneous operations component 145, demodulator 150, ECC decoder 155, and feedback component 160 of FIG. 1.

Figure 3:
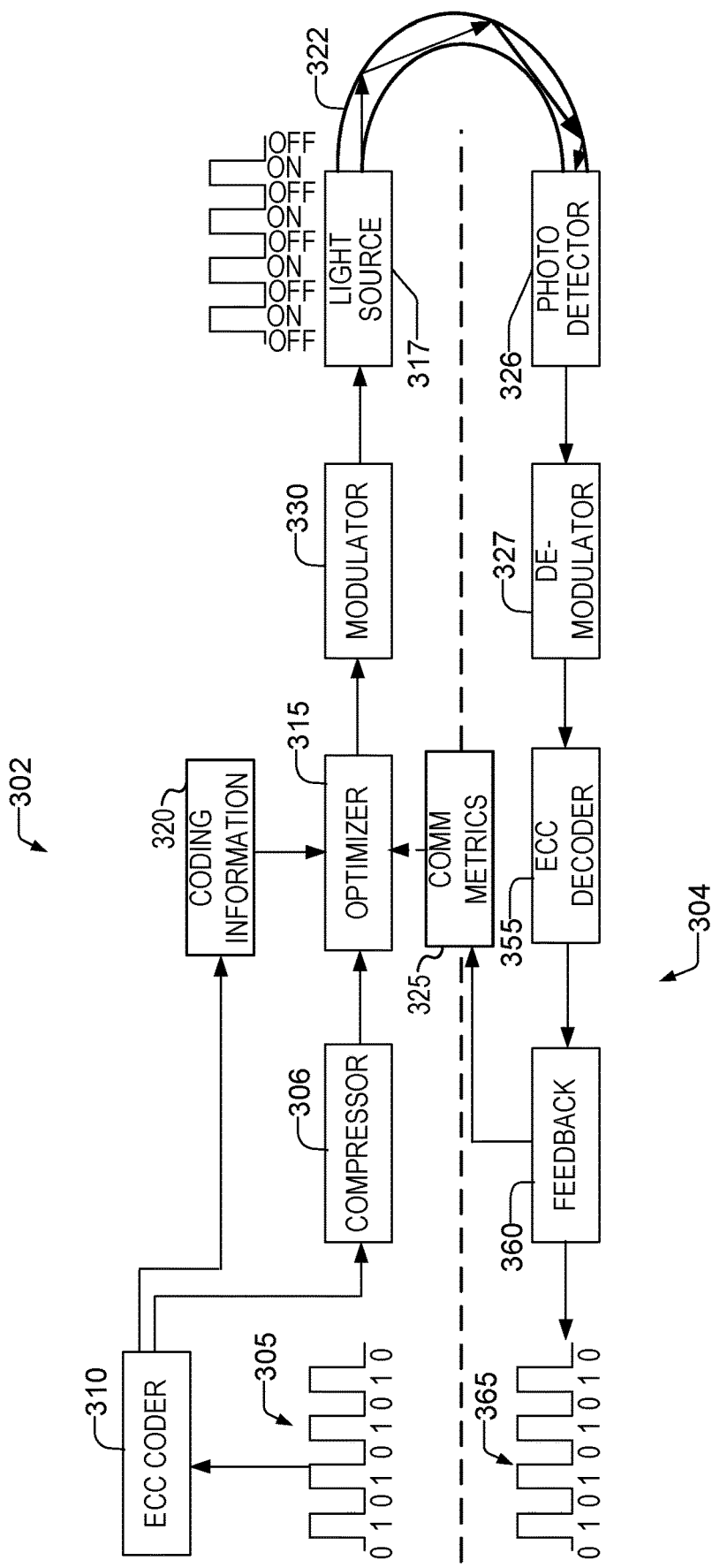
FIG. 3 illustrates an example optical transmitter and optical receiver according to some examples of the present disclosure.

FIG. 3 illustrates an example optical transmitter 302 and optical receiver 304 according to some examples of the present disclosure. Bitstream 305 may be received from higher networking layers or other components that are not shown. ECC Coder 310 may apply an ECC to the bitstream such as a forward error correction code. Example ECC may include block codes (e.g., Hamming codes), cyclic codes, BCH (Bose-Chaudhri-Hocquenghem) codes, Reed-Solomon codes, Convolutional codes (including Viterbi codes), and the like.

Power-based compressor 306 may compress repeated values in the encoded bitstream. For example, repeated symbols (e.g., bits) of a same value may be compressed to a single symbol transmitted at a power level that is correlated to the number of repeated symbols. For example, a value of '1' may be transmitted as a '1' with a power level of P1. A value of '1 1' may be transmitted as a '1' with a power level of P2 (in some examples P2>P1). A value of '1 1 1' may be transmitted as a '1' with a power level of P3 (where in some examples P3>P2). While the power-based compression is shown in the figure as occurring prior to optimization from optimizer 315, one of ordinary skill with the benefit of the present disclosure will appreciate that the power-based compression may be done in a variety of alternative places during processing of the bitstream for transmission. For example, before ECC coder 110 or after modulator 310. Power-based compressor 306 may utilize a mapping indicating corresponding power levels for a number of repeating values.

An optimizer 315 may modify one or more symbols of the coded bitstream. For example, the optimizer 315 may seek to optimize one or more optical communication metrics such as a PAPR and/or an error rate by modifying one or more bits or symbols of the coded bitstream. In some examples, the optimizer 310 may work with the power-based compressor 306 to reduce the peak transmissions. For example, the optimizer 310 may select one or more bits in the bitstream to change to reduce a peak transmission power according to the power-based compression applied by the power-based compressor 306.

Optimizer 315 may utilize information about the ECC coder 310, and optical communication metrics 325 of the communication medium to determine how many symbols may be changed. For example, the optimizer 315 may optimize more than one symbol and may determine, using the coding information 320 and communication metrics 325 to determine how many symbols to change. Coding information 320 may be the type of code applied, the number of symbols for each transmission window that can be corrected, and the like. As already noted, in some examples, the optimizer 315 may utilize the formula:

number of symbols to change=max−(expected errors+c)

Where max is the maximum number of symbols that can be changed based upon the ECC used, expected errors is the number of symbols that are expected to be received in error that are not intentionally changed by the transmitter given the current communication metrics, and c is a padding value to ensure that bit error rate is not increased. In some examples, c may be zero.

For example, optimizer 315 may change a symbol or bit of the bitstream to reduce a PAPR of the transmitter by eliminating long runs of consecutive bits that, because of the power-based compression, produce high transmission powers. For example, if the power level compression mapping was as follows:

| Bit Value | Power Level |
|---|---|
| 0 | P0 |
| 1 | P1 |
| 2 | P2 |
| 3 | P3 |
| 4 | P4 |
| 5 | P5 | where (P0 < P1 < P2 < P3 < P4 < P5)

A bitstream of: "1 0 1 1 1 1 0 1 0 1 1 1"—would be converted according to the power-based compression into seven separate transmissions of {(1,P1), (0,P0), (1,P4), (0,P0), (1,P1), (0,P0), (1,P3)}. In a simple modulation scheme in which the light source turns on to transmit a '1' and remains off for a transmission period to transmit a '0', the actual transmission powers would be P1, P0, P4, P0, P1, P0, P3. In order to reduce the power peak (and thus PAPR), a value of "1" in the sequence of four consecutive "1"s may be changed to a zero, thus turning the bitstream to, for example, "1 0 1 0 1 1 0 1 0 1 1 1". This produces transmission powers of P1, P0, P1, P0, P2, P0, P1, P0, P3.

Selecting which of the consecutive "1"s to change may be done by minimizing the transmission power needed to transmit the sequence (including the changed bits). For example, in the sequence "1 1 1 1" changing either the first or last bit to a zero would lower the maximum power level to transmit the sequence to P3 but changing either the second or third bits would change the maximum power level to P2, which is less than P3.

After the symbols are changed, the modulator 330 applies an optical modulation scheme, such as a pulse modulation, an orthogonal frequency division multiplexing (OFDM), a Quadrature Amplitude Modulation, or the like. For example, the modulator 330 may apply a QAM modulation scheme. Once the bits are modulated, other operations may be performed (not shown) such as amplification, clipping, or the like before it is transmitted across the communication medium by selectively activating the light source 317 (by turning the light source on and off; or by varying the amplitude of the light source to produce a carrier wave). The signals may be transmitted using light from light source 317 (e.g., a laser or a light emitting diode) through an optical communication medium, such as a fiber optic 322. Other mediums may include air, water, or the like. In some examples, transmitter 302, ECC coder 310, coding information 320, optimizer 315, communication metrics 325, and modulator 330 may be examples of transmitter 102 and/or 202; ECC coder 110 and/or 210; coding information 120 and/or 220; optimizer 115 and/or 215; communication metrics 125 and/or 225; and modulator 130 and/or 230 respectively of FIGS. 1 and 2.

Receiver 304 receives the transmitted symbols, for example, by utilizing a photon detector 326. In some examples, the photon detector may produce one or more photon counts for one or more transmission time periods. These counts are then demodulated by the demodulator 327 by applying a detection process for the modulated symbols according to the modulation scheme. For example, using one or more detection models that detect photon distributions at various power levels. ECC decoder 355 may find and correct errors by applying an appropriate decoding algorithm corresponding to the ECC algorithm applied by ECC coder 310. The decoded symbols may be checked for errors, and any errors may be corrected by the ECC decoder 355. This includes errors intentionally introduced by the optimizer 315.

Feedback component 360 may monitor, measure, or determine various parameters of the communication medium. Feedback component 360 may provide one or more communication metrics 325 to the transmitter. Communication metrics 325 may include a received signal strength, an error rate, a quality metric, or the like.

The output bitstream 365 is then passed to other components of the receiver that are not shown for clarity. In some examples, the miscellaneous operations component 340, demodulator 350, ECC decoder 355, and feedback component 360 may be examples of miscellaneous operations component 140 and/or 240; demodulator 150 and/or 250; ECC decoder 155 and/or 255; and feedback component 160 and/or 270 respectively of FIGS. 1 and 2.

Figure 4:
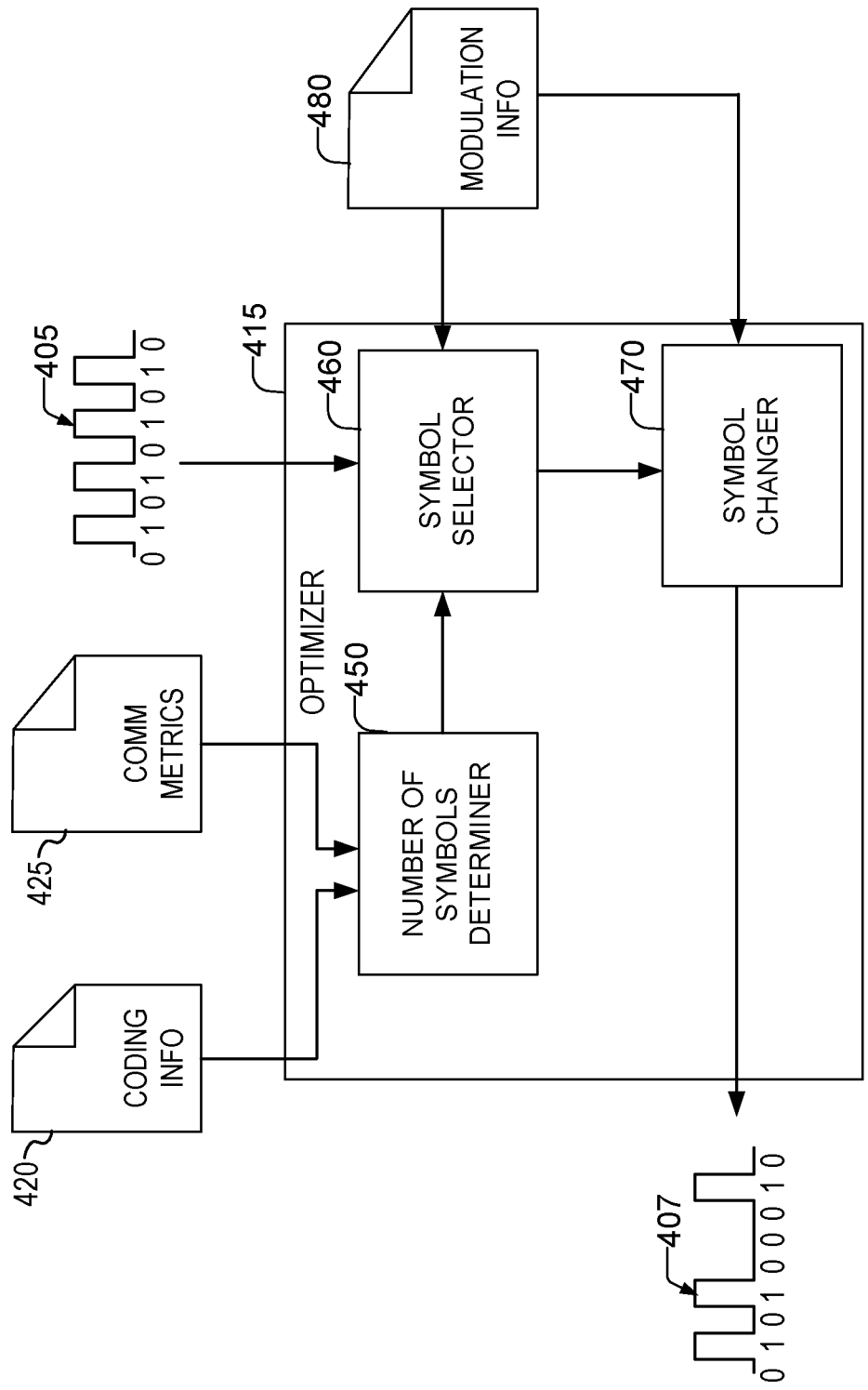
FIG. 4 illustrates an example of an optimizer according to some examples of the present disclosure.

FIG. 4 illustrates an example of an optimizer 415 according to some examples of the present disclosure. Optimizer 415 is an example implementation of optimizers 115, 215, 315, and the like. Optimizer 415 may take as input a bitstream 405 (which may be encoded with an ECC), one or more communication metrics 425, and coding information 420. Coding information 420 may be the type of code applied, the number of symbols for each transmission window that can be corrected, and the like. Number of symbols determiner 450 may determine the number of symbols the optimizer will change. Symbol selector 460 may determine the symbols to change, and symbol changer 470 may change each symbol to a different value.

The number of symbols determiner 450 may use a variety of techniques to determine the number of symbols that are intentionally changed by optimizer 415. In one example, the number of symbols determiner 450 may use the maximum number of symbols that may be corrected using the ECC applied. In some examples, the number of symbols determiner 450 may reduce the number of symbols that are changed if the receiver reports uncorrectable ECC errors or requests retransmissions. In yet other examples, the number of symbols determiner 450 may initially determine that less than the maximum number of symbols is to be changed and then slowly increment the number of symbols that are changed over time until an ECC uncorrectable error is reported by the receiver to the transmitter or a retransmission is requested. The number of symbols determiner 450 may then reduce the number of symbols until a maximum number of symbols is found that does not cause uncorrectable ECC errors at the receiver. The number of symbols determiner 450 may constantly adjust the number of symbols changed by the optimizer 415 to respond to changing channel conditions.

In other examples, the number of symbols determiner 450 may start with the maximum number of possible symbols and discount it by a value based upon an expected number of symbols that will be changed by the communication channel. For example, the number of symbols determiner 450 may utilize the formula:

number of symbols to change=max−(expected errors+c)

Where max is the maximum number of symbols that can be changed based upon the ECC used, expected errors is the number of symbols that are expected to be received in error by the receiver that are not intentionally changed by the transmitter given the current communication metrics, and c is a padding value to ensure that bit error rate is not increased. In some examples, c may be zero. As previously noted, the max may be based upon the ECC applied to (or to be applied to) bitstream 405. For example, the ECC may have a maximum number of bits that may be corrected for a given transmission size. For example, x symbols may be corrected for every y symbols transmitted.

Number of bits determiner 450 may determine the expected errors that indicates the errors caused by the communication channel based upon the communication metrics 425. The expected errors are errors that the transmitting device did not intend to cause but were caused by communication conditions on the communication medium. As noted previously, this may be calculated based upon one or more communication metrics 425. For example, based upon a formula, a past history of symbol errors, an average number of errors over a period of time, a machine-learning model, or the like. In some examples, the communication metrics 425 may include one or more of a received signal strength, a bit error rate, a signal quality metric, or the like. In some examples, the communication metrics 425 may be historical data of the channel over time. For example, a number of errors that were introduced by the channel (and not the transmitter) over a predetermined period of time, an average error rate, and the like.

As previously described, in some examples, the number of symbols determiner 450 may initially start with the maximum number of symbols that can be corrected for a first time period t. In some examples, rather than report a number of uncorrectable ECC the receiver may report a total number of symbols actually corrected. If the number of symbols actually corrected exceeds the number of symbols intentionally introduced by the transmitter, the system may infer that the channel conditions introduced one or more errors and may subsequently reduce the number of symbols that are intentionally changed. For example, the number of symbols determiner 450 may calculate a number of symbols received in error that are caused by the communication channel by subtracting the number of symbols actually corrected (as reported by the receiver) by the number of symbols intentionally changed by the transmitter for that time period. The number of symbols to be changed in the current transmission period may be the difference between the maximum number of symbols that can be changed by the ECC and the number of symbols received in error that were caused by the communication channel for a past transmission. In some examples, the number of symbols determiner 450 may utilize an average number of symbols received in error that were caused by the communication channel over a particular time period.

As previously described, the number of symbols determiner 450 may initially specify that a first (starting) number of symbols may be changed. In some examples, the starting number of symbols may be a maximum number of symbols that may be corrected by the ECC that is applied. In other examples, the starting number may be one symbol. In other examples, the starting number may be a midpoint between one and the maximum number of symbols that may be corrected. As the transmitter transmits and the receiver provides feedback through communication metrics 425, the receiver may increase the number of symbols that are intentionally changed by a value z if the receiver is not reporting any uncorrectable ECC errors (e.g., the number of errors corrected by the ECC does not exceed the maximum number of correctable errors). On the other hand the receiver may decrease the number of symbols that are intentionally changed by z (or some other number) if the receiver reports uncorrectable ECC errors.

The value z may be specified by an administrator or may be calculated based upon the optimization goal. For example, if lowering the PAPR is the optimization goal, then z may be a range of values that may be based upon a current PAPR. If the PAPR is high, then z may be a maximum value in the range, if PAPR is currently low, then z may be the minimum value in the range.

Symbol selector 460 selects a number of symbols specified by the number of symbols determiner 450 to intentionally change in the bitstream 405. For example, if the number of symbols determiner 450 indicates that four symbols may be changed, the symbol selector may select up to four symbols. In some examples, the symbol selector 460 may always select exactly the number of symbols to change indicated by the number of symbols determiner 450, but in other examples, the symbol selector 460 may select up to the number of symbols to change. For example, the optimization goal may not be served by changing as many symbols as specified by the number of symbols determiner 450. For example, if there are very few maximum power transmission peaks in the bitstream it may not be desirable to increase an error rate.

Symbol selector 460 may select symbols of the bitstream 405 in a manner that achieves one or more of the communication metric optimization goals. For example, to reduce PAPR, one or more symbols which are transmitted at high peak powers may be changed to symbols that are transmitted at lower peak powers. In some examples, transmission powers are calculated for each of the symbols in the bitstream. If the number of symbols determiner 450 indicates that s symbols are capable of being changed, then the s symbols that have a highest peak power level may be selected. In some examples, a minimization function may be applied that may iteratively change each combination of s symbols of the bitstream (which may have >s symbols) to different symbols (e.g., random symbols or symbols that have a minimum transmission power) and recalculate a PAPR for the bitstream. The s symbols that achieve a minimum PAPR may be selected.

For examples in which the communication metric optimization goal seeks to lower error rate, in some examples, the symbol selector 460 may select up to s symbols that have neighboring symbols that are a closer than a threshold distance on a constellation map to the selected s symbols. Modulation information 480 may be utilized to determine distance between symbols on the constellation map. Modulation information 480 may include a constellation map or table that maps symbols to transmission powers, phases, or indicates distances between various symbols. For example, if the constellation diagram 235 from FIG. 2 is used, then a bit sequence of "0011" is a distance of one to bit sequences of "0010," "0000," and "0001" and a distance of two to bit sequences of "1001," "1000," "1100," "0100," and "0110" and so on. The symbol selector may calculate a distance for each symbol between a preceding and next symbol and change the s symbols with the closest distances. In other examples, the receiver may track which symbols and/or symbol sequences have previously caused errors and may provide this to the symbol selector 460. For example, in a QAM environment, certain symbols and/or amplitudes may be subject to interference while other symbols are not. In these examples, symbols that have an error rate (e.g., the number of errors divided by the number of total transmissions of the symbol) above a threshold may be selected to be changed by the symbol selector.

In yet other examples, symbols may be selected by one or more machine-learning algorithms. These examples are described more fully with the discussion of FIG. 13.

In examples in which an optical transmitter applies a power-based compression algorithm, the bitstream 405 may be the bitstream before or after the ECC is applied. The power-based compression may be applied after the optimizer 410 or before the optimizer and may be reflected in the bitstream 405. In the case where the power-based compression is already applied to the bitstream 405, the information about power levels of each bit may be supplied with the bitstream 405 or be part of the modulation information 480. The symbol selector 460 in these cases may seek to reduce PAPR and may select symbols as previously described.

Symbol changer 470 may change the selected symbols to produce a modified bitstream 407. Symbol changer 470 may change a symbol from a first value to a second value. The second value may be selected based upon one or more of: the first value, the modulation information 480, communication metrics 425, coding information 420, the optimization goal, or the like. For example, if the optimization goal is to reduce bit error rate, the symbol changer 470 may change the selected symbol to be a furthest distance on a constellation map from the symbols that are before and after the selected symbol to maximize the distance for easier detection by the receiver. If the optimization goal is to reduce PAPR, the second symbol may be selected to be a lower power symbol. The symbols are changed to a value that does not represent the corresponding portion of the input bitstream and will be determined to be in error at the receiver.

Figure 5:
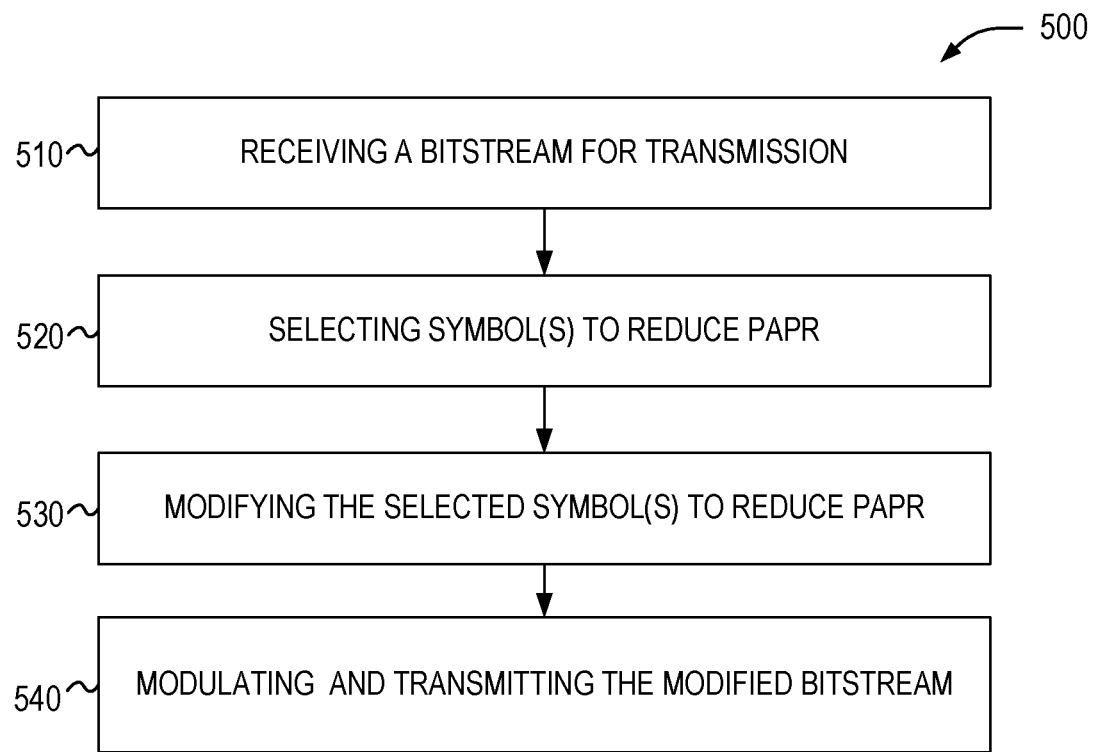
FIG. 5 illustrates a flowchart of a method of modifying symbols that are to be transmitted to reduce a PAPR according to some examples of the present disclosure.

FIG. 5 illustrates a flowchart of a method 500 of modifying symbols that are to be transmitted to reduce a PAPR according to some examples of the present disclosure. At operation 510 the bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 510.

At operation 520 the system may select one or more symbols to change in the bitstream. The symbols may be selected to reduce PAPR. For example, the symbols selected at operation 520 may be symbols that would, when transmitted, generate a high peak power level. For example, in a QAM modulation scheme, a symbol that would be transmitted at a high amplitude. In an optical modulation scheme, for example, a modulation scheme with a power-based compression algorithm, a series of repeated consecutive values above a threshold number of values may generate a high peak power level. The selected one or more symbols may be symbols that would produce the highest power in a particular transmission window (which may be equivalent to a block size of an FEC code). In some examples, the selection is for a first n symbols that exceed a threshold transmission power, where n is the number of symbols that are to be changed. In still other examples, symbols with a greatest variation in power level (or a power level variation that exceeds a threshold variation) from neighboring signals may be selected to be changed to minimize power spikes that may damage the transmitter. In these examples, the system may further require that the power level exceed a threshold (as spikes that are low power may not be damaging).

At operation 530, the one or more selected symbols may be changed. The change may be from a first value to a second value, the second value based upon the goal of optimizing the PAPR. The second value is a symbol value that, when received by the receiver, is not converted to the original value of the bitstream as received at operation 510 without the use of ECC to correct the value to the original value. In the case of PAPR reduction, the second symbol may be a symbol that is transmitted at a lower peak power, or that would produce a lower PAPR. At operation 540 the system may modulate the modified bitstream according to a modulation scheme and transmit the modulated modified bitstream and/or symbols. For example, optically, over radio frequency waves, or the like.

Figure 6:
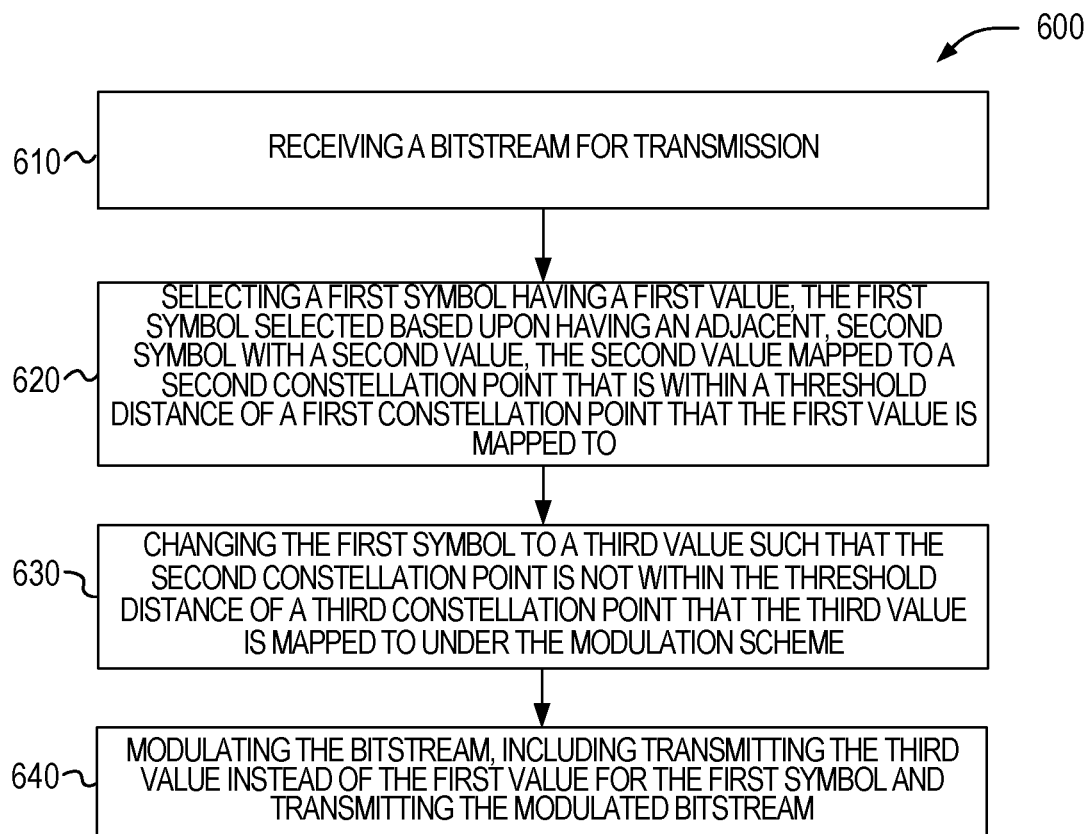
FIG. 6 illustrates a flowchart of a method of modifying symbols that are to be transmitted to reduce an error rate according to some examples of the present disclosure.

FIG. 6 illustrates a flowchart of a method 600 of modifying symbols that are to be transmitted to reduce an error rate according to some examples of the present disclosure. At operation 610 the bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 610.

At operation 620 the system may select one or more symbols to change in the bitstream. The symbols selected at operation 620 may be symbols that would, when transmitted, increase an error rate. For example, the transmitter may select a first symbol from the plurality of symbols mapped under a modulation scheme to a first constellation point with an adjacent, second symbol mapped under the modulation scheme to a second constellation point—the second constellation point within a threshold distance to the first constellation point. In some examples, receiving computing devices may have trouble differentiating two symbols that are very close together on the constellation map, especially if the channel is noisy. As noted above, it is possible to downgrade the modulation scheme to achieve higher separation. However, the actual incidence of symbols being mapped to constellation points that are close to each other may be low enough where the symbols can be changed on the transmitter and corrected on the receiver without downgrading the modulation scheme. This allows for continued high data rates while at the same time reducing error rates in noisy environments. In some examples, two constellation points may be within a threshold distance if their distance on the constellation map is within a threshold distance. In other examples, two constellation points may be within a threshold distance if their phase and amplitudes are within a threshold distance of each other.

In other examples, the transmitter may utilize implicit and/or explicit feedback from the receiver on which constellation points are more likely to produce an error. Implicit feedback may include retransmission requests and explicit feedback may include specific symbol and error rates and the like. Since a retransmission request is for an entire packet, with potentially many different symbols, in some examples, the transmitter may correlate, based upon multiple retransmission requests, one or more transmission symbols that are common to the retransmission requests. These symbols may be changed to avoid these errors and to reduce error rate.

At operation 630, the one or more selected symbols may be changed. The change may be from a first value to a second value. The second value is a symbol value that, when received by the receiver, is not converted to the original value of the bitstream as received at operation 610 without the use of ECC. In the case of error rate reduction, the second symbol may be a symbol that is not within a threshold distance of the first value and/or neighboring symbols or is not one of the symbols that has historically caused errors at the receiver. At operation 640 the system may modulate the modified bitstream and/or symbols according to a modulation scheme and transmit the modulated modified bitstream and/or symbols. For example, optically, over radio frequency waves, or the like.

In some examples, the system may learn patterns of symbols that may cause errors on the receiver. For example, via feedback that indicates symbols were received in error or otherwise corrected. In these examples, the system may store a plurality of symbols before and/or after the symbol that was received in error. The system may apply one or more pattern matching algorithms to determine patterns of symbols that cause errors. These symbols may be changed at the time of transmission to another pattern that is not likely to cause an error.

Figure 7:
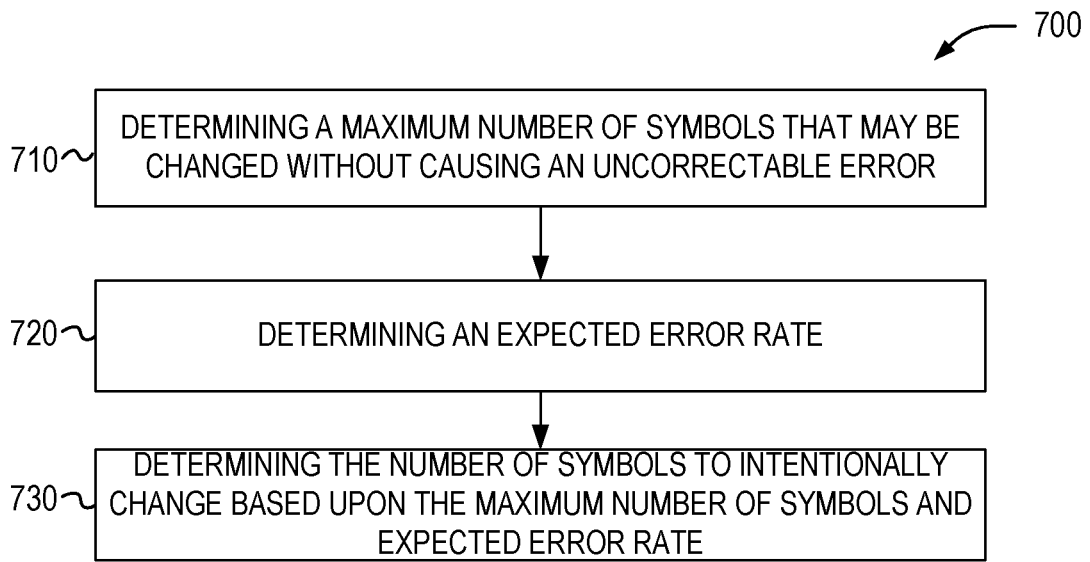
FIG. 7 illustrates a flowchart of a method of determining how many symbols can be changed according to some examples of the present disclosure.

FIG. 7 illustrates a flowchart of a method 700 of determining how many symbols can be changed according to some examples of the present disclosure. In some examples, more than one symbol may be changed for a particular transmission window. The transmission window may be determined based upon a block size or other size of the ECC used on the bitstream. At operation 710, the transmitter may identify or determine a maximum number of symbols that can be changed for the current transmission window. This may be done using a lookup table that maps ECC algorithms and their parameters to a maximum number of symbols. For example, if the ECC is able to correct up to 2-byte errors per 32-byte block, the transmission window would be 32 bytes and the maximum number of symbols that may be changed without causing an uncorrectable error would be 2 bytes. For a QAM16 modulation scheme where there are 4 bits per symbol, the above ECC could correct 4 symbols for every 64 symbols received.

In some examples, the transmitter may use all these symbols. This may be sensible where the transmission channel is very good and well controlled. For example, some short-range fiber optic installations may have almost zero error introduced by the channel. For other environments this is not feasible as the channel will introduce errors. If the system intentionally changes all the redundancy in the ECC, any error introduced by the channel will lead to retransmissions. Thus, the maximum number may be reduced by an expected number of errors introduced by the communication channel or interface. At operation 720, the transmitter may identify or determine an expected error rate caused by the communication channel. At operation 730, the number of symbols that may be intentionally changed may be determined based upon the maximum number of symbols that may be changed that was determined in operation 710 as well as the expected error rate in operation 720.

For example, based upon past channel conditions, if it may be inferred that an average of 2 symbols are changed by the channel for every 64 symbols, and the ECC can successfully correct 4 symbols for every 64 symbols, the number of symbols to intentionally change may be 2 symbols for every 64 symbols. In some examples, there may be a constant c which may be a buffer against channel variability. For example, while an average error rate may be 2 symbols every 64 symbols, the channel conditions may fluctuate. To ensure that intentional changing of symbols does not cause uncorrectable ECC errors and thus retransmissions, the system may utilize a buffer c. In the example above, c may be 1. The result of operation 730 may thus be that the system may intentionally change one symbol in 64 symbols.

In some examples, the maximum number of symbols that may be changed may change if the ECC used changes. The expected error rate determined at 720 may change over time as the channel conditions change. Additionally, c, may be static or may change over time. For example, c may be based upon a measure of variability of the expected error rate. If the error rate is relatively static and constant, c may be low (or zero). Conversely, if the channel is volatile and the error rate fluctuates substantially, c may be larger to reflect the variability in conditions. For example, c may be set based upon a deviation of the channel conditions across a sample set from an average condition.

Figure 8:
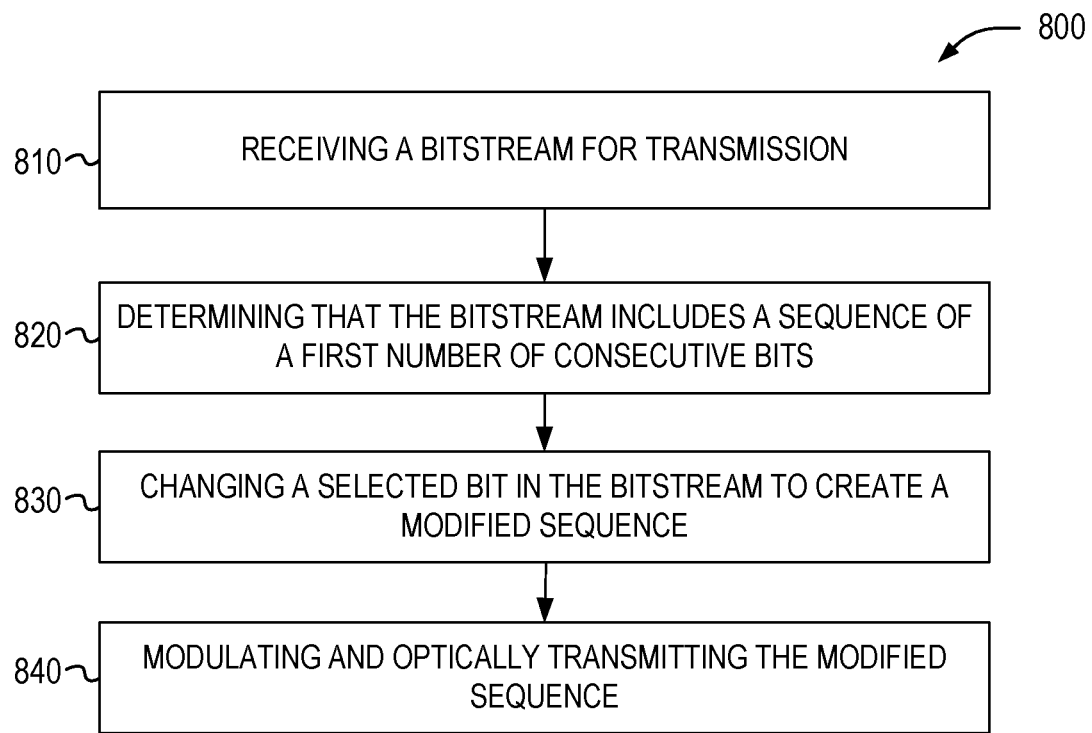
FIG. 8 illustrates a flowchart of a method of modifying symbols that are to be transmitted optically according to a power-based compression scheme according to some examples of the present disclosure.

FIG. 8 illustrates a flowchart of a method 800 of modifying symbols that are to be transmitted optically according to a power-based compression scheme according to some examples of the present disclosure. At operation 810 the bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 810.

At operation 820 the system may determine that the bitstream includes a sequence of a first number of consecutive bits of a same first value. The sequence associated with a first peak transmission power that is correlated with the first number of consecutive bits in the sequence. For example, if the bitstream is "0 1 1 1 0" then the three repeating 1's constitutes a sequence of consecutive bits of a first value (1'). In a power-based compression scheme, the "1 1 1" would be transmitted as a single "1" but at a peak power level that is correlated to the first number of consecutive bits (in this example, three). In some examples, the power level is positively correlated to the first number of consecutive bits such that increasing numbers of repeated values are transmitted as a single value but at a power level that increases for each additional value. Thus, "1 1 1" would be transmitted at a greater power level than "1 1".

At operation 830, one or more selected consecutive bits may be changed to a different value to create a modified sequence. The modified sequence including a second number of the one or more consecutive bits from the sequence with the first value, the second number less than the first number, the modified sequence associated with a second peak transmission power to transmit the modified sequence that is correlated with the second number, the second peak transmission power lower than the first peak transmission power. For example, if the bit stream is "0 1 1 1 0" then one of the "1" bits may be changed to a zero. For example, the bitstream may be changed to "0 1 0 1 0". The change may be from a first value to a second value (e.g., 1 to a 0). By changing a value in the sequence identified at operation 820 one or more modified sequences are created. For example if the bitstream is "1 0 1 1 1 1 1 0 1" and the sequence of repeating values is "1 1 1 1 1" and one of the "1" values is changed to "0" this creates one or more modified sequences of "1" s. For example, if the middle bit is changed to a zero, two modified sequences are created of "1 1" and "1 1". If the first bit is changed, then a single modified sequence is created of "1 1 1 1", and so on. These modified sequences are transmitted at a lower peak transmission power than the original sequence by the power based compression algorithm (as there are shorter sequences of the same value).

At operation 840 the system may transmit the modified sequence optically. For example, the bitstream (as modified) may be transmitted by selectively activating the light source and/or varying an amplitude of the light source according to a modulation scheme. For example, by selectively activating the light source to transmit a single bit of the first value at the second peak transmission power.

Figure 9:
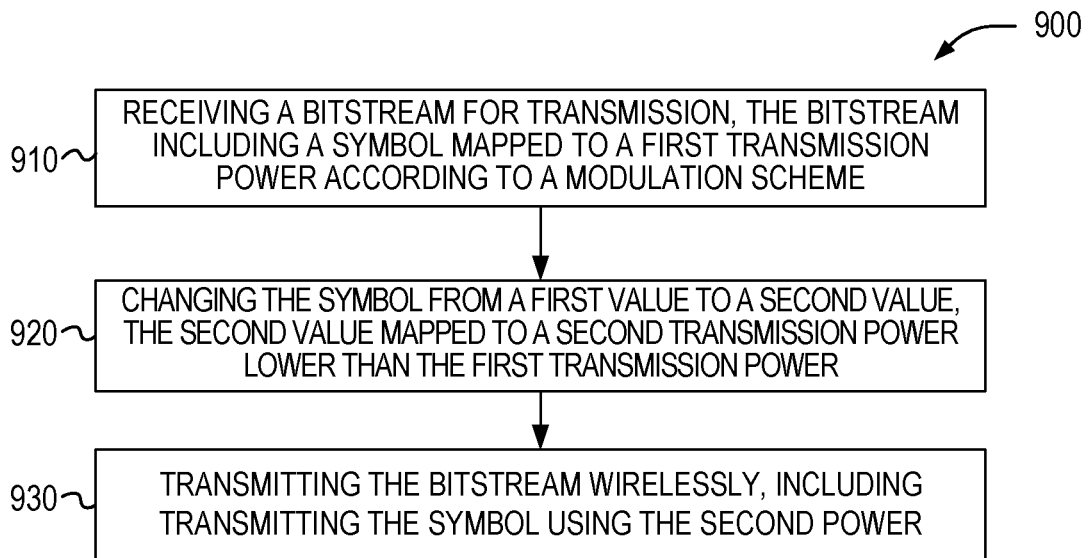
FIG. 9 illustrates a flowchart of a method of modifying symbols that are to be transmitted wirelessly using RF to reduce a PAPR according to some examples of the present disclosure.

FIG. 9 illustrates a flowchart of a method 900 of modifying symbols that are to be transmitted wirelessly using RF to reduce a PAPR according to some examples of the present disclosure. At operation 910 the bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 910. The bitstream may include a symbol that is mapped or correlated to a first transmission power according to a modulation scheme. For example, according to a QAM modulation scheme.

In some examples, the symbol may be selected from a plurality of symbols of the bitstream based upon having an associated transmission power over a threshold. In some examples, the symbol may be selected by having a highest associated transmission power for bits of the bitstream that are to be transmitted over a specified transmission window.

In some examples, multiple symbols may be selected. In these examples, the selection changes a first n symbols that exceed a threshold transmission power, where n is the number of symbols that are to be changed. In still other examples, symbols with a greatest variation in power level (or a power level variation that exceeds a threshold variation) from neighboring signals may be selected to be changed to minimize power spikes that may damage the transmitter. In these examples, the system may further require that the power level exceed a threshold (as spikes that are low power may not be damaging).

At operation 920 the system may change the symbol from a first value to a second value, the second value mapped to a transmission power lower than the first transmission power according to the modulation scheme. The change may be from a first value to a second value. The second value is a symbol value that, when received by the receiver, is not converted to the original value of the bitstream as received at operation 910 without the use of ECC. In the case of PAPR reduction, the second symbol may be a symbol that is transmitted at a lower peak power. At operation 930 the system may transmit the modified bitstream and/or symbols wirelessly using radio frequency waves, including transmitting the symbol as the second value using the second transmission power. For example, the bitstream (as modified) may be modulated using one or more modulation schemes (such as QAM, PSK, and the like) and transmitted.

Spread Requirement

When selecting symbols to change, it may be desirable to spread the introduced errors out within the transmission window. For example, certain ECC may be faster and may produce fewer uncorrectable ECC when errors are well distributed throughout the transmission window. In some examples, the system may select symbols to change not only based upon achieving communication metric optimization goals, but in addition, or instead, selecting symbols that meet a threshold measure of spread that describes how distributed the positions of the corresponding selected symbols are to other, non-selected symbols from the bitstream.

A measure of spread may be a minimum distance between respective selected symbols, an average distance between respective selected symbols, a variance of the selected symbols, and the like. In some examples, the thresholds may be specified by an administrator of the system. In other examples, the thresholds may be based upon the ECC properties. That is, ECC algorithms may have varying tolerances for successive or close together errors and by adjusting the threshold of the measurement of spread, the system may tailor its behavior to the ECC algorithm utilized. For example, the less tolerant the ECC algorithm is to errors that are close together, the greater the threshold on the measurement of spread.

In some examples, the measure of spread may be also used to reduce latency at the receiver. For example, a large number of errors in a close span of each other may cause intensive computations at the receiver. In these examples, the threshold may be set based upon the hardware of the receiver and how fast the receiver can correct ECC errors. In these examples, the threshold may be increased if the receiver is using slow hardware. In still other examples, the type of data transmitted may be used to dynamically change the threshold. For example, data that is intolerant of latency may have a high threshold, whereas data that is tolerant of latency may have a lower threshold.

Figure 10:
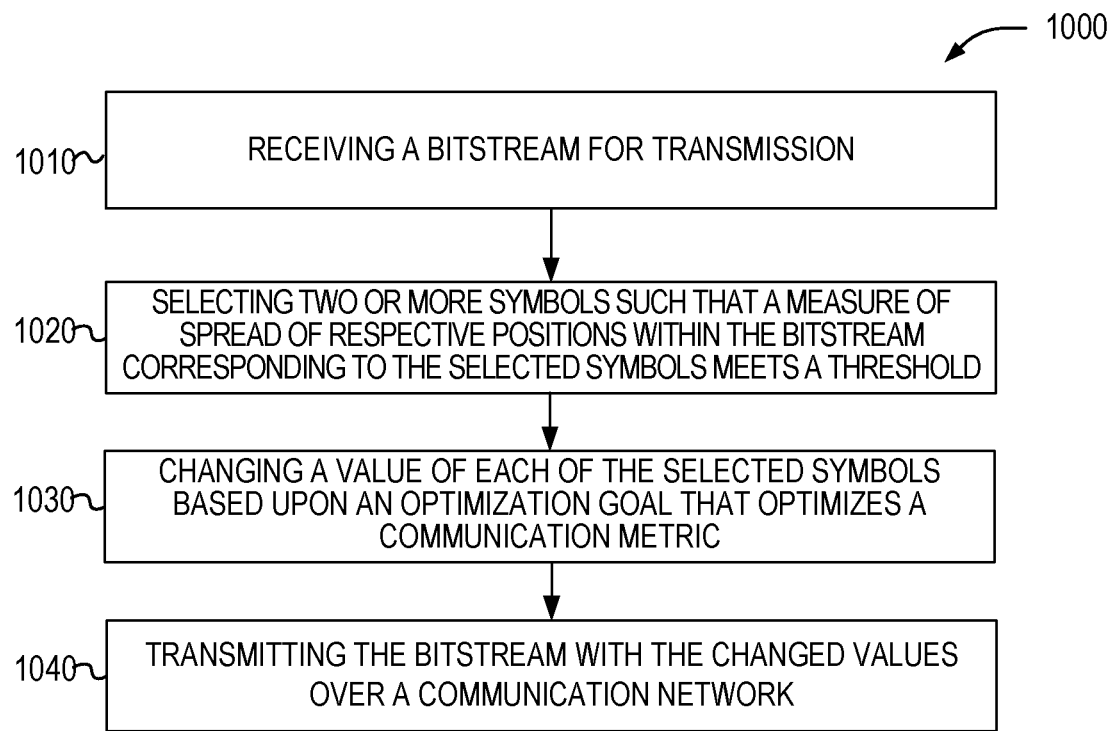
FIG. 10 illustrates a flowchart of a method of modifying symbols that are to be transmitted such that the symbols are well distributed according to some examples of the present disclosure.

FIG. 10 illustrates a flowchart of a method 1000 of modifying symbols that are to be transmitted such that the symbols are well distributed according to some examples of the present disclosure. At operation 1010, the bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 1010.

At operation 1020, two or more of a plurality of symbols corresponding to the bitstream may be selected such that a measure of spread of respective positions within the bitstream corresponding to the selected symbols meets a threshold. The symbols may be selected to meet a communication metric optimization goal and also to meet a threshold measure of spread. In some examples, a measure of spread may be a measure of how distributed the selected symbols are within the symbols of the transmission window. In some examples, the measure of spread may be a greatest distance, an average distance, or the like between respective symbols. The measure of spread may be a variance of the selected symbols within the bitstream.

At operation 1030, the system may change a value of each of the selected symbols based upon an optimization goal that optimizes a communication metric. The change may be from a first value to a second value. The second value is a symbol value that, when received by the receiver, is not converted to the original value of the bitstream as received at operation 1010 without the use of ECC. In the case of an optimization goal of reduction of a PAPR, the second symbol may be a symbol that is transmitted at a lower peak power. In examples in which the optimization goal is reduction of error rate, the second symbol may be a symbol less likely to produce an error at the receiver. At operation 1040 the system may transmit the modified bitstream and/or symbols over a communication network. For example, the bitstream (as modified) may be modulated using one or more modulation schemes (such as QAM, PSK, and the like) and transmitted. In other examples, the modified bitstream and/or symbols may be transmitted optically.

Dynamic Communication Metric Optimization Goal Selection

As previously mentioned, the system may select and change symbols to meet one or more communication metric optimization goals, such as reducing PAPR, reducing errors, or the like. In some examples, the system may attempt to achieve both. For example, if the system can change n symbols perk symbols transmitted, then some of the n symbols may be changed to reduced PAPR, and some of the n symbols may be changed to reduce errors. For example, the system may specify a ratio of the total number of symbols that may be changed that goes towards each optimization goal. For example, in a 50-50 split, n/2 symbols may be changed to lower PAPR and n/2 symbols may be changed to lower error rate.

In other examples, the system may change symbols based upon a plurality of rules. For example, the system may first change symbols that exceed a threshold power during the transmission window. If there are additional symbols that can be changed, symbols with neighbors that are close on the constellation map may be changed (or symbols that have frequent reception errors as reported by the receiver). Conversely, a rule may specify that symbols with neighbors within a threshold distance may be changed first and any left-over symbols that may be changed may be changed to lower PAPR.

In some examples, the system may dynamically determine which communication metric optimization goals to achieve. The system may dynamically change symbols during a same transmission window or for each transmission window. For example, the system may continuously monitor one or more channel metrics. For example, a received signal strength (RSSI) of the signal received by the receiver, an error rate, a PAPR, and the like. The system may apply a set of rules to determine, based upon the metrics, which communication metric optimization goal(s) to select. For example, if the PAPR is low, but the error rate is high, the system may select to optimize the error rate—potentially at the expense of PAPR.

In some examples, the decision rules may output a proportion of symbols to change to achieve multiple communication metric optimization goals. For example, if both PAPR and error rate are high, but PAPR is a more serious problem, then symbols may be changed to achieve both objectives, but more symbols may be adjusted to fix the PAPR issue. The proportions may be determined by formulas given in the rules. For example, based upon a deviation from a threshold. Thus, if both the PAPR and the error rate deviate from their respective thresholds, the proportion of symbols to fix to optimize PAPR may be a ratio that is calculated based upon the amount each communication metric optimization goal deviates from the thresholds.

The rules may be a set of if-then-else statements, one or more formulas, a decision tree, a neural network, a regression, or the like. Models that are supervised learning models may be utilized that are trained with historical metrics and labels with the proportion for each optimization goal. The resulting model determines a proportion of symbols based upon the number of symbols available to change and the channel metrics. In some examples, models may operate directly on the bitstream and the channel metrics to not only determine what symbols to change, but what values to change them to. As before, the models may be decision trees, neural networks, classification, regression, or the like and may be trained with historical bitstreams, and channel metrics with labels that indicate which symbols to change and to what. In some examples, the labels may be calculated using one or more optimization algorithms that optimize all desired channel metrics.

In some examples, a context of the transmitter and/or receiver may be utilized instead of, or in addition to the channel metric. Example contexts include a battery level, a geographic location (e.g., determined by using Global Positioning System (GPS), WiFi signals, inertial navigation, a combination of two or more of GPS, WiFi, and inertial navigation, or the like), an activity of user of the device, data needs of the device, QoS data of the bitstream, and the like. For example, if the transmitter's battery level is low, the device may prioritize lowering a PAPR or even an average power level, a total power level, or the like. Similarly, a user's motion may be used to determine a communication metric optimization goal. For example, if the user is in motion, the system may prioritize error rate to combat changing multipath reflections that may increase an error rate. In other examples, the system may learn communication metric optimization goals for particular locations. Thus, through crowd sourced data the system may determine channel metrics for various locations and ideal optimizations for those locations. The user's location may then be matched to a particular location in a database and the database may have desired optimization goals for that location.

An activity of the user of the device and data needs of the device may also be determined and considered when selecting a communication metric optimization goal. For example, the user may be conducting a video call that prioritizes latency over bandwidth. In these examples, the system may seek to reduce error (which reduces retransmissions). In other examples, the user may be downloading a large file. In these examples the system may seek to reduce a PAPR to preserve device battery (even if the battery currently has plenty of charge). The user's activity may be evidenced by the QoS data, the application that produced the bitstream (e.g., application specific settings may be used that selects a different optimization goal based upon the application source of the bitstream), sensor data that shows the user's activity, and the like.

In some examples, the device context may be used alone to select the communication metric optimization goal and/or proportion of symbols to use for each goal or may be used in combination with the current channel metrics. The various models described above for the channel metrics may also be utilized for the device contexts. For example, a set of rules that may be a set of if-then-else statements, a decision tree, a neural network, a regression, or the like. Models that are supervised learning models may be utilized that are trained with historical contexts and labels with the proportion for each communication metric optimization goal. The resulting model determines a proportion of symbols based upon the number of symbols available to change and the device contexts. In some examples, models may operate directly on the bitstream and the device contexts to not only determine what symbols to change, but what values to change them to. As before, the models may be decision trees, neural networks, classification, regression, or the like and may be trained with historical bitstreams and contexts with labels that indicate which symbols to change and to what.

In examples in which both contexts and channel metrics are utilized, a set of rules may be utilized that may be a set of if-then-else statements, a decision tree, a neural network, a regression, or the like. Models that are supervised learning models may be utilized that are trained with historical contexts, metrics, and labels with the proportion for each optimization goal. The resulting model determines a proportion of symbols based upon the number of symbols available to change and the device contexts. In some examples, models may operate directly on the bitstream, channel metrics, and the device contexts to not only determine what symbols to change, but what values to change them to. As before, the models may be decision trees, neural networks, classification, regression, or the like and may be trained with historical bitstreams, metrics, and contexts with labels that indicate which symbols to change and to what.

Figure 11:
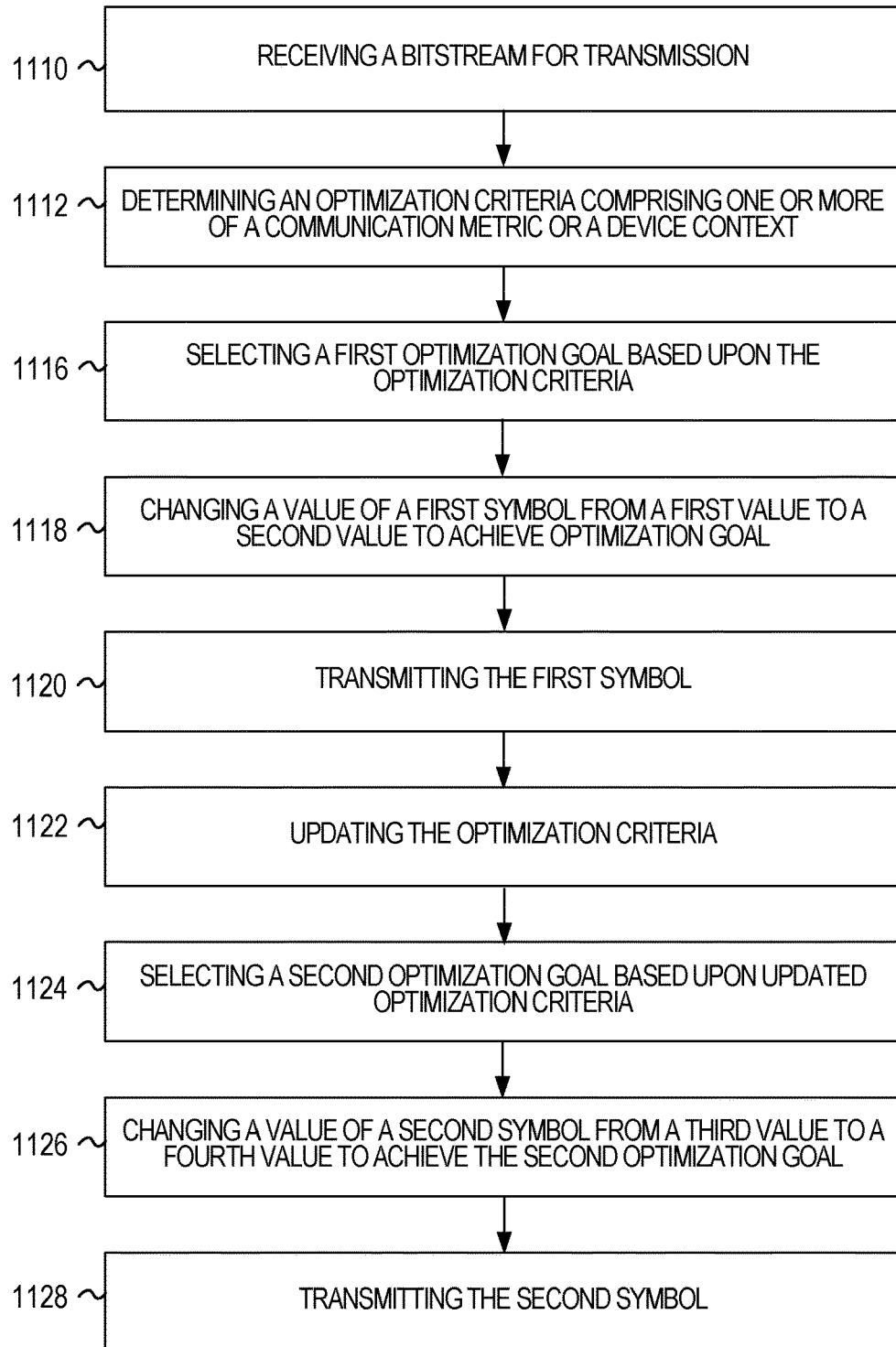
FIG. 11 illustrates a flowchart of a method 1100 of modifying symbols that are to be transmitted to achieve a dynamically selected goal according to some examples of the present disclosure.

FIG. 11 illustrates a flowchart of a method 1100 of modifying symbols that are to be transmitted to achieve a dynamically selected goal according to some examples of the present disclosure. At operation 1110, the system may receive a bitstream for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 1110.

At operation 1112, the system may determine one or more optimization criteria comprising communication metrics of a communication channel that the bitstream is transmitted across or a device context of the device. In some examples, the communication metric may include an error rate, a PAPR, a signal strength (as measured by the receiver), a signal quality (as measured by the receiver), or the like. The device context may be any measurable state of the device, including battery level, location, motion, information about the data being transmitted (e.g., Quality of Service properties), or the like. The device contexts may be device contexts of the receiver and/or the transmitter.

At operation 1116, a first optimization goal may be selected based upon the optimization criteria. For example, based upon a set of one or more rules, machine-learning models, or the like. As noted previously, both the channel metrics and device contexts may be utilized, or just the device context and not the channel metrics, or just the channel metrics and not the device contexts.

At operation 1118, a value of one or more first symbols may be selected and changed to optimize the optimization goal selected at operation 1116. For example, if the selected optimization goal is to optimize PAPR, symbols transmitted with a high peak power may be changed to symbols transmitted with lower power levels. If the selected optimization goal is to reduce error rate, symbols that have, in the past, caused errors at the receiver may be changed. In other examples, if the selected optimization goal is to reduce error rate, symbols that have neighbors that are within a threshold distance on a constellation chart of the modulation scheme used may be selected and changed such that the changed symbols are over the threshold distance. At operation 1120 the one or more first symbols are transmitted with the changed value. For example, the transmitter modulates the symbol and causes it to be transmitted using RF, light waves, or the like.

At operation 1122, the one or more optimization criteria may be updated. The channel metrics and/or device contexts may be determined by the transmitter, by the receiver and sent to the transmitter, or the like. At operation 1124, a second optimization goal may be selected based upon the updated optimization criteria determined at operation 1122. In some examples, the second optimization goal may be a same or a different optimization goal then the one determined at operation 1116. The second optimization goal may be selected using a same or a different process as used in operation 1116—for example, based upon a set of one or more rules, machine-learning models, or the like.

At operation 1126, a value of one or more second symbols may be selected and changed to optimize the second optimization goal selected at operation 1124. At operation 1128, the transmitter may transmit the one or more second symbols.

Increasing Power Levels to Allow for Changing More Symbols

One constraint on the number of symbols that may be intentionally changed by the transmitter includes a number of errors introduced by the communication channel. The more symbols that need to be corrected based upon noise or other conditions of the communication channel, the fewer symbols can be intentionally modified by the transmitter. In order to reduce the error rate caused by the channel and increase the number of symbols that may be intentionally changed by the transmitter, the system may increase a transmitter power level. For example, an average power level of the transmissions. This may help the transmitter reduce noise on the receiver and reduce errors. The margin gained by this technique may then be utilized to more effectively achieve one of the desired optimization goals. In some examples, the average power level may be increased by increasing a transmission power level of all symbols.

Figure 12:
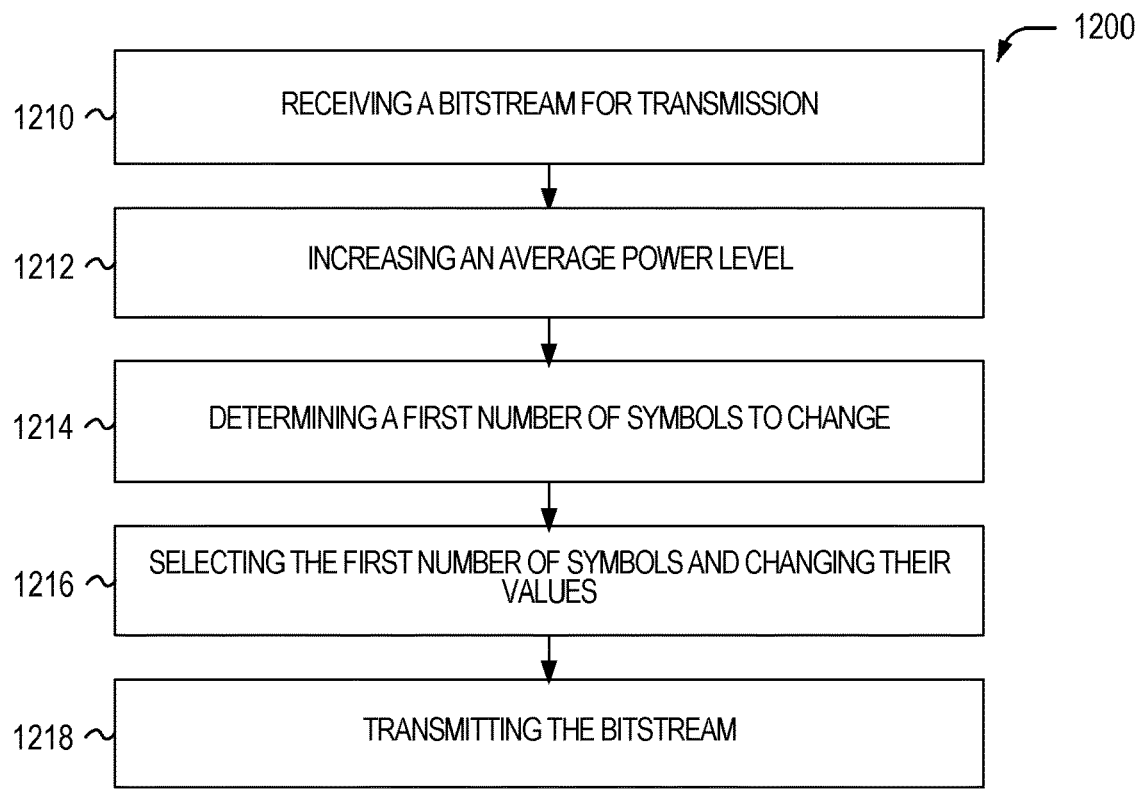
FIG. 12 illustrates a flowchart of a method of increasing a power level of transmissions of a transmitter to increase a number of symbols that are changed according to some examples of the present disclosure.

Turning now to FIG. 12, a flowchart of a method 1200 of increasing a power level of transmissions of a transmitter to increase a number of symbols that are changed is illustrated according to some examples of the present disclosure. At operation 1210, a bitstream may be received for transmission. For example, an application on a computing device may send data to be transmitted. Thus, the data may be received over an internal bus, a memory buffer, or the like. In other examples, the data may be received over an external communication link, such as a network connection or the like. The bitstream may have already had an ECC applied to it prior to operation 1210.

At operation 1212, the average power level to transmit a portion of the bitstream may be increased. The increased average power level is greater than an average power level specified by a communication protocol for transmitting the portion of the bitstream given a current communication channel conditions. For example, if the bitstream would normally be transmitted at an average power level of x operation 1212 increases x by y. In other words, the bitstream received at operation 1210 may be associated with an average power level. For example, the bits in the bitstream may be transmitted according to a modulation scheme which assigns a particular amplitude to each of the symbols of the bitstream. The average power level may be the average amplitude of all the symbols of the bitstream. At operation 1212, to increase the average power level, the amplitude with which to transmit each symbol at may be increased a same amount. In other examples, each symbol may be increased a different amount such that symbols of the constellation chart may be spaced further apart. For example, in a QAM constellation as shown in FIG. 2, the symbols that are assigned to a highest amplitude may have their power levels increased more than symbols that have lower amplitudes to spread the constellation out further.

At operation 1214, a first number of symbols to intentionally change may be determined. For example, based upon applying a channel metric to a first function. For example, using the process of FIG. 7. The first number of symbols at operation 1214 is greater than the number of symbols that would have been changed prior to increasing the average power level at operation 1212. That is, the number of symbols to change at operation 1214 is greater than the number of symbols to change that the first function would indicate if the channel metric were input to the first function prior to changing the power level at operation 1212.

At operation 1216, a value of one or more first symbols may be selected and changed to optimize an optimization goal. For example, if the optimization goal is to optimize PAPR, symbols transmitted with a high peak power may be changed to symbols transmitted with lower power levels. If the optimization goal is to reduce error rate, symbols that have, in the past, caused errors at the receiver may be changed. In other examples, if the selected optimization goal is to reduce error rate, symbols that have neighbors that are within a threshold distance on a constellation chart of the modulation scheme used may be selected and changed such that the changed symbols are over the threshold distance. At operation 1218 the one or more first symbols are modulated and transmitted with the changed values. For example, the transmitter modulates the symbol and causes it to be transmitted using RF, light waves, or the like.

In some examples, the increased average power level determined at operation 1212 may be determined based upon a target number of symbols to change. In some examples, the target number of symbols to change may be based upon a target communication metric optimization goal. That is, the system may determine a target average power level based upon a number of symbols the system would like to change. This may be based upon a formula or table that correlates an average power level, the current communication metrics, and the number of symbols that may be changed. At operation 1212, the system may increase the transmission power levels to achieve this target. As noted, the target number of symbols to change may be based upon the target communication metric optimization goal. For example, a table or formula may correlate the current communication metric with an improved communication metric and the number of symbols that would need to be changed to meet that goal. This is then used to select an average power level. In some examples, at operation 1214, the determining the first number of symbols to change may occur prior to operation 1212 in order to determine a number of symbols to change to determine what the average power level increase should be.

Machine Learning

Figure 13:
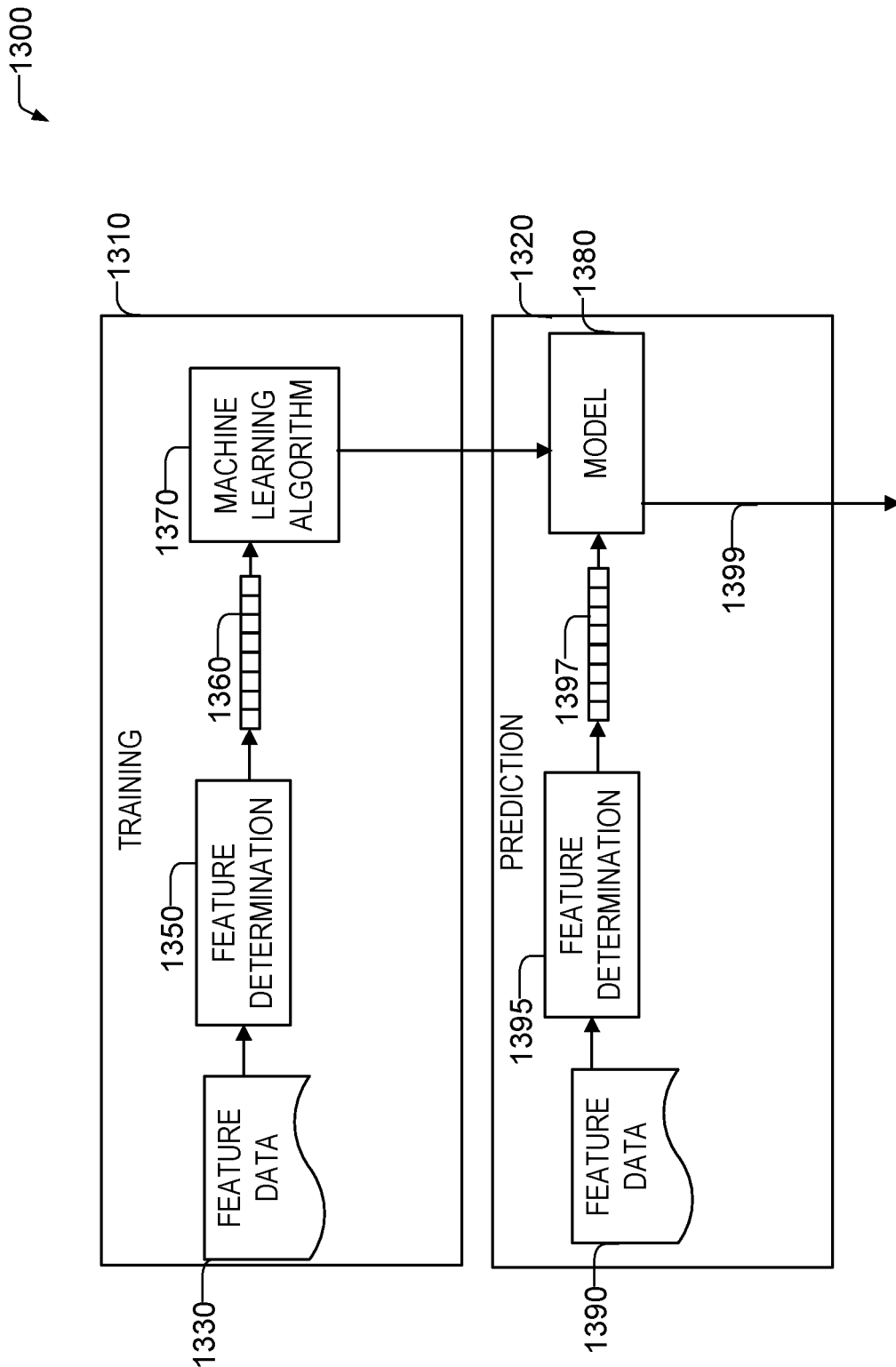
FIG. 13 illustrates an example machine learning module according to some examples of the present disclosure.

FIG. 13 illustrates an example machine learning module 1300 according to some examples of the present disclosure. The machine learning module 1300 may be implemented in whole or in part by the transmitter such as transmitter 102. In some examples, the training module 1310 may be implemented by a different device than the prediction module 1320. In these examples, the model 1380 may be created on a first machine and then sent to a second machine.

Machine learning module 1300 utilizes a training module 1310 and a prediction module 1320. Training module 1310 inputs feature data 1330 into feature determination module 1350. Feature determination module 1350 determines one or more features for feature vector 1360 from the feature data 1330. Features chosen for inclusion in the feature vector 1360 may be all the feature data 1330 or in some examples, may be a subset of all the feature data 1330. In examples in which the features chosen for the feature vector 1360 are a subset of the feature data 1330, a predetermined list of which feature data 1330 is included in the feature vector may be utilized. The feature vector 1360 may be utilized (along with any applicable labels) by the machine learning algorithm 1370 to produce a model 1380.

In the prediction module 1320, the current feature data 1390 of the user may be input to the feature determination module 1395. Feature determination module 1395 may determine the same set of features or a different set of features as feature determination module 1350. In some examples, feature determination module 1350 and 1395 are the same modules or different instances of the same module. Feature determination module 1395 produces feature vector 1397, which are input into the model 1380 to produce results 1399.

The training module 1310 may operate in an offline manner to train the model 1380. The prediction module 1320, however, may be designed to operate in an online manner. It should be noted that the model 1380 may be periodically updated via additional training and/or user feedback. The machine learning algorithm 1370 may be selected from among many different potential supervised or unsupervised machine learning algorithms. Examples of supervised learning algorithms include artificial neural networks, convolutional neural networks, Bayesian networks, instance-based learning, support vector machines, decision trees (e.g., Iterative Dichotomiser 3, C4.5, Classification and Regression Tree (CART), Chi-squared Automatic Interaction Detector (CHAID), and the like), random forests, linear classifiers, quadratic classifiers, k-nearest neighbor, linear regression, logistic regression, and hidden Markov models. Examples of unsupervised learning algorithms include expectation-maximization algorithms, vector quantization, and information bottleneck method. Unsupervised models may not have a training module 1310 or may not utilize labels on feature data 1330.

The model 1380 may be utilized in one example to select symbols in the bitstream to change and/or the value to change it to. In these examples, the feature data 1330 and 1390 may include the bitstream, an optimization goal, and for the training module 1310, a label indicating which symbols to change—or an optimization function so that the machine learning algorithm 1370 can determine a proper symbol and change given the feature data 1330. In some examples, the feature data 1330, and 1390 may also include modulation info, such as what each symbol in the bitstream is modulated to, context information of the user, and/or channel metrics. The features of feature vectors 1360 and 1397 may be feature data 1330 and 1390 determined to be predictive of a symbol and the value to change the symbol to.

In other examples, the model 1380 may be utilized to select an optimization goal. For example, the feature data 1330 and 1390 may channel metrics, device contexts, and the like. The training feature data 1330 may be labelled with a desired optimization goal. The feature vectors 1360 and 1397 may be feature data 1330 and 1390 that are predictive of an optimization goal. The output of the model 1399 may be an optimization goal, or a ratio between various optimization goals (e.g., 30% of symbols changed to reduce PAPR, 70% to reduce error rate), or the like.

In yet other examples, the model 1380 may be utilized to determine a number of expected symbol errors in the communication channel to assist in determining how many symbols may be intentionally changed. In these examples, the feature data 1330 and 1390 may be channel metrics and/or the symbols for transmission during a particular transmission window. The training feature data 1330 may be labelled with the number of observed symbol errors for that given data caused by the communication channel conditions. The feature vectors 1360 and 1397 may be feature data 1330 and 1390 that are predictive of a number of symbol errors. The output of the model 1399 may be a number of expected symbol errors.

As noted herein, symbols are changed intentionally by the transmitter from the value received by upper levels. As previously noted, in some examples, rather than changing symbols from a first value to a second value, some ECC allow more erasures than errors. Thus, in these examples, the symbols may be deleted and not transmitted. This may take advantage of the fact that some ECC algorithms can correct more missing data errors than errors caused by incorrect data. As used herein, transmission power levels static power levels, or may describe amplitudes of a carrier wave that transmits data.

Figure 14:
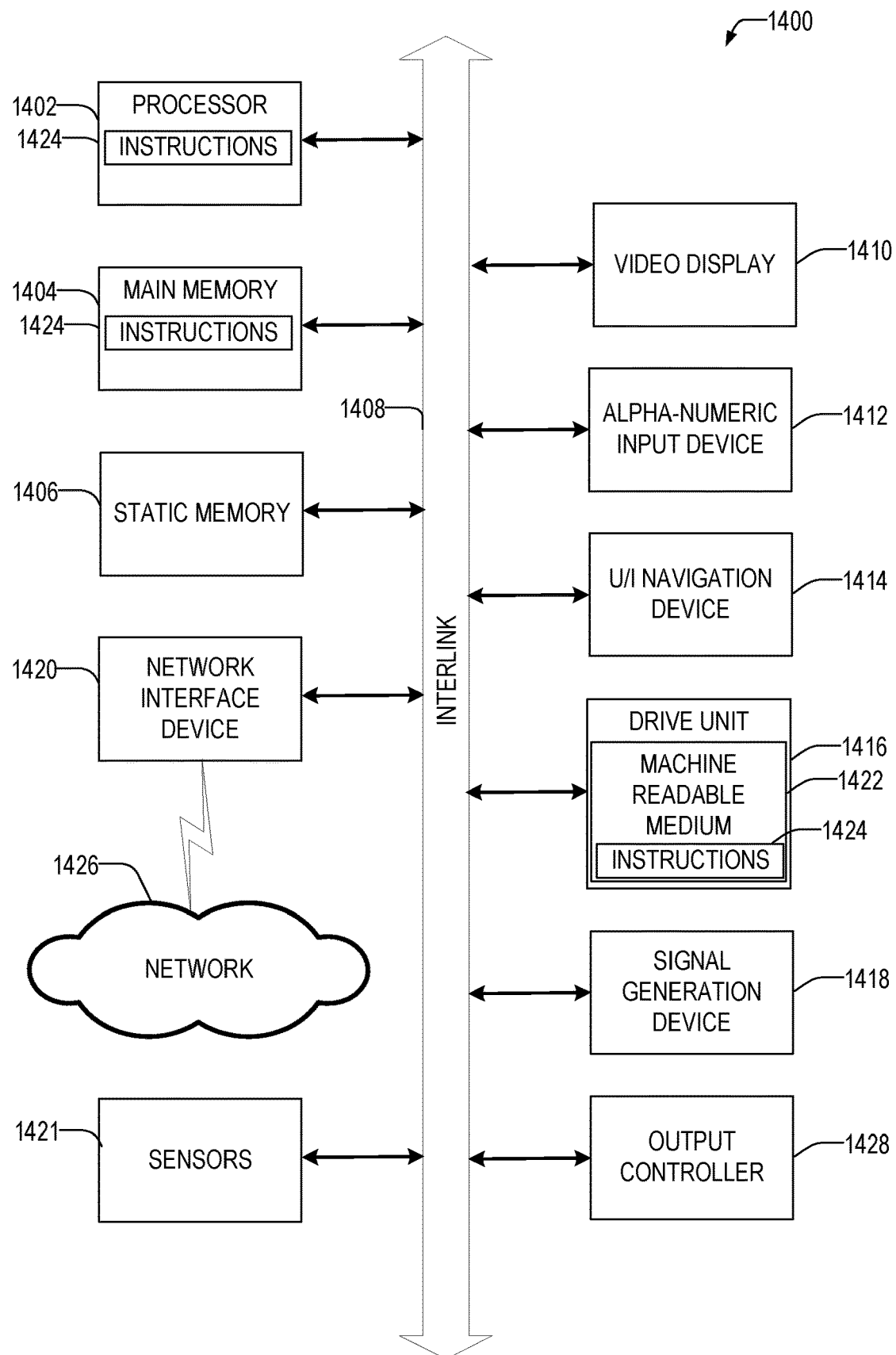
FIG. 14 is a block diagram illustrating an example of a machine that may implement the disclosed embodiments according to some examples of the present disclosure.

FIG. 14 illustrates a block diagram of an example machine 1400 that may implement any one or more of the techniques disclosed herein according to some examples of the present disclosure. In alternative embodiments, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a base station, a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Machine 1400 may implement a transmitter such as transmitters 102, 202, 302, implement optimizer 415, training module 1310, prediction module 1320. Machine 1400 may implement a receiver, such as receivers 104, 204, 304. Machine 1400 may implement the methods of FIGS. 5-12. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms (hereinafter "modules"). Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 1400 may include a hardware processor 1402 (e.g., a central processing unit (CPU), a graphics processing unit (GPU), a hardware processor core, or any combination thereof), a main memory 1404 and a static memory 1406, some or all of which may communicate with each other via an interlink (e.g., bus) 1408. The machine 1400 may further include a display unit 1410, an alphanumeric input device 1412 (e.g., a keyboard), and a user interface (UI) navigation device 1414 (e.g., a mouse). In an example, the display unit 1410, input device 1412 and UI navigation device 1414 may be a touch screen display. The machine 1400 may additionally include a storage device (e.g., drive unit) 1416, a signal generation device 1418 (e.g., a speaker), a network interface device 1420, and one or more sensors 1421, such as a global positioning system (GPS) sensor, compass, accelerometer, or other sensor. The machine 1400 may include an output controller 1428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1416 may include a machine readable medium 1422 on which is stored one or more sets of data structures or instructions 1424 (e.g., software) embodying or utilized by any one or more of the techniques or functions described herein. For example, a non-transitory machine readable medium. The instructions 1424 may also reside, completely or at least partially, within the main memory 1404, within static memory 1406, or within the hardware processor 1402 during execution thereof by the machine 1400. In an example, one or any combination of the hardware processor 1402, the main memory 1404, the static memory 1406, or the storage device 1416 may constitute machine readable media.

While the machine readable medium 1422 is illustrated as a single medium, the term "machine readable medium" may include a single medium or multiple media (e.g., a centralized or distributed database, and/or associated caches and servers) configured to store the one or more instructions 1424.

The term "machine readable medium" may include any medium that is capable of storing, encoding, or carrying instructions for execution by the machine 1400 and that cause the machine 1400 to perform any one or more of the techniques of the present disclosure, or that is capable of storing, encoding, or carrying data structures used by or associated with such instructions. Machine readable medium includes a non-transitory machine readable medium. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine readable media. In some examples, machine readable media may include machine readable media that is not a transitory propagating signal.

The instructions 1424 may further be transmitted or received over a communications network 1426 using a transmission medium via the network interface device 1420. The Machine 1400 may communicate with one or more other machines utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1420 may include one or more physical jacks (e.g., Ethernet, coaxial, or phone jacks) or one or more antennas to connect to the communications network 1426. In an example, the network interface device 1420 may include a plurality of antennas to wirelessly communicate using at least one of single-input multiple-output (SIMO), multiple-input multiple-output (MIMO), or multiple-input single-output (MISO) techniques. In some examples, the network interface device 1420 may wirelessly communicate using Multiple User MIMO techniques.

Other Notes and Examples

Example 1 is a method for optically transmitting data over an optical communication path, the method comprising: receiving a bitstream for transmission; determining that the bitstream includes, a sequence of a first number of consecutive bits with a same first value, the sequence associated with a first peak transmission power that is correlated with the first number of consecutive bits in the sequence; changing a selected bit in the sequence of consecutive bits from the first value to a second value that is different than the first value to create a modified sequence, the modified sequence including a second number of the one or more consecutive bits from the sequence with the first value, the second number less than the first number, the modified sequence associated with a second peak transmission power to transmit the modified sequence that is correlated with the second number, the second peak transmission power lower than the first peak transmission power; and optically transmitting the modified sequence over the optical communication path by selectively activating a light source to transmit a single bit of the first value at the second peak transmission power.

In Example 2, the subject matter of Example 1 includes, wherein the bitstream has an error correction code applied to it, and wherein the second value of the selected bit is corrected back to the first value using an error correction code on a receiver.

In Example 3, the subject matter of Examples 1-2 includes, determining a maximum number of correctable bits based upon an error correction code applied to the bitstream; determining a number of bits to be changed based on the maximum number of correctable bits; and changing a set of second bits in the bitstream, the set of second bits including the selected bit and a size of the set of second bits based on the number of bits to be changed.

In Example 4, the subject matter of Example 3 includes, wherein determining the number of bits to be changed based on the maximum number of correctable bits comprises: determining an expected number of errors of the optical communication path upon which the bitstream is transmitted; and determining the number of bits that can be changed based upon the expected number of errors and the maximum number of correctable bits.

In Example 5, the subject matter of Example 4 includes, wherein determining the expected number of errors comprises determining a number of bits that were previously changed by the optical communication path during a previous transmission.

In Example 6, the subject matter of Examples 1-5 includes, identifying the selected bit in the bitstream by applying a minimization function such that a peak transmission power of the modified sequence is minimized.

In Example 7, the subject matter of Examples 1-6 includes, identifying a peak to average power level ratio of a transmitter that transmits the bitstream over a predetermined period of time; and identifying the selected bit in the sequence so as to produce a reduction to the peak to average power level ratio that is one of: a maximum reduction, or a reduction that is over a threshold reduction.

Example 8 is a device for optically transmitting data over an optical communication path, the device comprising: a processor; a memory, the memory storing instructions, which when executed by the processor, causes the processor to perform operations comprising: receiving a bitstream for transmission; determining that the bitstream includes, a sequence of a first number of consecutive bits with a same first value, the sequence associated with a first peak transmission power that is correlated with the first number of consecutive bits in the sequence; changing a selected bit in the sequence of consecutive bits from the first value to a second value that is different than the first value to create a modified sequence, the modified sequence including a second number of the one or more consecutive bits from the sequence with the first value, the second number less than the first number, the modified sequence associated with a second peak transmission power to transmit the modified sequence that is correlated with the second number, the second peak transmission power lower than the first peak transmission power; and optically transmitting the modified sequence over the optical communication path by selectively activating a light source to transmit a single bit of the first value at the second peak transmission power.

In Example 9, the subject matter of Example 8 includes, wherein the bitstream has an error correction code applied to it, and wherein the second value of the selected bit is corrected back to the first value using an error correction code on a receiver.

In Example 10, the subject matter of Examples 8-9 includes, wherein the operations further comprise: determining a maximum number of correctable bits based upon an error correction code applied to the bitstream; determining a number of bits to be changed based on the maximum number of correctable bits; and changing a set of second bits in the bitstream, the set of second bits including the selected bit and a size of the set of second bits based on the number of bits to be changed.

In Example 11, the subject matter of Example 10 includes, wherein the operations of determining the number of bits to be changed based on the maximum number of correctable bits comprises: determining an expected number of errors of the optical communication path upon which the bitstream is transmitted; and determining the number of bits that can be changed based upon the expected number of errors and the maximum number of correctable bits.

In Example 12, the subject matter of Example 11 includes, wherein the operations of determining the expected number of errors comprises determining a number of bits that were previously changed by the optical communication path during a previous transmission.

In Example 13, the subject matter of Examples 8-12 includes, wherein the operations further comprise: identifying the selected bit in the bitstream by applying a minimization function such that a peak transmission power of the modified sequence is minimized.

In Example 14, the subject matter of Examples 8-13 includes, wherein the operations further comprise: identifying a peak to average power level ratio of a transmitter that transmits the bitstream over a predetermined period of time; and identifying the selected bit in the sequence so as to produce a reduction to the peak to average power level ratio that is one of: a maximum reduction, or a reduction that is over a threshold reduction.

Example 15 is a machine-readable medium that stores instructions for optically transmitting data over an optical communication path, the instructions, when executed by a machine, causes the machine to perform operations comprising: receiving a bitstream for transmission; determining that the bitstream includes, a sequence of a first number of consecutive bits with a same first value, the sequence associated with a first peak transmission power that is correlated with the first number of consecutive bits in the sequence; changing a selected bit in the sequence of consecutive bits from the first value to a second value that is different than the first value to create a modified sequence, the modified sequence including a second number of the one or more consecutive bits from the sequence with the first value, the second number less than the first number, the modified sequence associated with a second peak transmission power to transmit the modified sequence that is correlated with the second number, the second peak transmission power lower than the first peak transmission power; and optically transmitting the modified sequence over the optical communication path by selectively activating a light source to transmit a single bit of the first value at the second peak transmission power.

In Example 16, the subject matter of Example 15 includes, wherein the bitstream has an error correction code applied to it, and wherein the second value of the selected bit is corrected back to the first value using an error correction code on a receiver.

In Example 17, the subject matter of Examples 15-16 includes, wherein the operations further comprise: determining a maximum number of correctable bits based upon an error correction code applied to the bitstream; determining a number of bits to be changed based on the maximum number of correctable bits; and changing a set of second bits in the bitstream, the set of second bits including the selected bit and a size of the set of second bits based on the number of bits to be changed.

In Example 18, the subject matter of Example 17 includes, wherein the operations of determining the number of bits to be changed based on the maximum number of correctable bits comprises: determining an expected number of errors of the optical communication path upon which the bitstream is transmitted; and determining the number of bits that can be changed based upon the expected number of errors and the maximum number of correctable bits.

In Example 19, the subject matter of Example 18 includes, wherein the operations of determining the expected number of errors comprises determining a number of bits that were previously changed by the optical communication path during a previous transmission.

In Example 20, the subject matter of Examples 15-19 includes, wherein the operations further comprise: identifying the selected bit in the bitstream by applying a minimization function such that a peak transmission power of the modified sequence is minimized.

In Example 21, the subject matter of Examples 15-20 includes, wherein the operations further comprise: identifying a peak to average power level ratio of a transmitter that transmits the bitstream over a predetermined period of time; and identifying the selected bit in the sequence so as to produce a reduction to the peak to average power level ratio that is one of: a maximum reduction, or a reduction that is over a threshold reduction.

Example 22 is a device for optically transmitting data over an optical communication path, the device comprising: means for receiving a bitstream for transmission; means for determining that the bitstream includes, a sequence of a first number of consecutive bits with a same first value, the sequence associated with a first peak transmission power that is correlated with the first number of consecutive bits in the sequence; means for changing a selected bit in the sequence of consecutive bits from the first value to a second value that is different than the first value to create a modified sequence, the modified sequence including a second number of the one or more consecutive bits from the sequence with the first value, the second number less than the first number, the modified sequence associated with a second peak transmission power to transmit the modified sequence that is correlated with the second number, the second peak transmission power lower than the first peak transmission power; and means for optically transmitting the modified sequence over the optical communication path by selectively activating a light source to transmit a single bit of the first value at the second peak transmission power.

In Example 23, the subject matter of Example 22 includes, wherein the bitstream has an error correction code applied to it, and wherein the second value of the selected bit is corrected back to the first value using an error correction code on a receiver.

In Example 24, the subject matter of Examples 22-23 includes, means for determining a maximum number of correctable bits based upon an error correction code applied to the bitstream; means for determining a number of bits to be changed based on the maximum number of correctable bits; and means for changing a set of second bits in the bitstream, the set of second bits including the selected bit and a size of the set of second bits based on the number of bits to be changed.

In Example 25, the subject matter of Example 24 includes, wherein the means for determining the number of bits to be changed based on the maximum number of correctable bits comprises: means for determining an expected number of errors of the optical communication path upon which the bitstream is transmitted; and means for determining the number of bits that can be changed based upon the expected number of errors and the maximum number of correctable bits.

In Example 26, the subject matter of Example 25 includes, wherein the means for determining the expected number of errors comprises means for determining a number of bits that were previously changed by the optical communication path during a previous transmission.

In Example 27, the subject matter of Examples 22-26 includes, means for identifying the selected bit in the bitstream by applying a minimization function such that a peak transmission power of the modified sequence is minimized.

In Example 28, the subject matter of Examples 22-27 includes, means for identifying a peak to average power level ratio of a transmitter that transmits the bitstream over a predetermined period of time; and means for identifying the selected bit in the sequence so as to produce a reduction to the peak to average power level ratio that is one of: a maximum reduction, or a reduction that is over a threshold reduction.

Example 29 is a method for wirelessly transmitting data using radio frequency waves, the method comprising: receiving a bitstream for RF transmission, a symbol corresponding to the bitstream having a first value mapped to a first transmission power according to a modulation scheme; selecting a second value for the symbol based upon the second value mapping to a second transmission power that is lower than the first transmission power according to the modulation scheme; changing the symbol from the first value to the second value; and transmitting the bitstream wirelessly including transmitting the symbol using the second transmission power.

In Example 30, the subject matter of Example 29 includes, wherein the method further comprises applying an error correction code to the bitstream prior to changing the symbol.

In Example 31, the subject matter of Examples 29-30 includes, wherein the symbol is characterized by an amplitude and a phase shift and wherein changing the symbol from the first value to the second value comprises changing one or more of the amplitude or phase.

In Example 32, the subject matter of Examples 29-31 includes, wherein the symbol is characterized by a sequence of one or more bits and wherein changing the symbol from the first value to the second value comprises changing the bits in the sequence.

In Example 33, the subject matter of Examples 29-32 includes, wherein the second value is corrected back to the first value using an error correction code on a receiver.

In Example 34, the subject matter of Examples 29-33 includes, wherein the modulation scheme is a quadrature amplitude modulation scheme.

In Example 35, the subject matter of Examples 29-34 includes, determining a number of symbols that can be corrected using an error correction code; determining a number of symbols to be changed based on the number of symbols that can be corrected; and changing a set of symbols in the bitstream, the set of symbols including the symbol and wherein a size of the set of symbols is based on the number of symbols to be changed.

In Example 36, the subject matter of Example 35 includes, wherein determining the number of symbols to be changed based upon the number of symbols that can be corrected comprises: determining an expected number of errors of a wireless channel upon which the bitstream is transmitted; and determining the number of symbols to be changed based upon the expected number of errors and the number of symbols that can be corrected using an error correction code.

In Example 37, the subject matter of Example 36 includes, wherein determining the expected number of errors comprises determining a number of symbols that were previously changed by conditions of a communication channel over which the bitstream was transmitted during previous transmissions.

In Example 38, the subject matter of Examples 29-37 includes, identifying the symbol by applying a minimization function such that a peak transmission power of a plurality of symbols is minimized.

In Example 39, the subject matter of Examples 29-38 includes, identifying a peak to average power level ratio of a transmitter that transmits the bitstream over a predetermined period of time; and identifying the symbol to produce a reduction to the peak to average power level ratio that is one of: a maximum reduction, or a reduction that is over a threshold reduction.

Example 40 is a device for wirelessly transmitting data using radio frequency waves, the device comprising: a processor; a memory, storing instructions, which when executed by the processor, causes the processor to perform operations comprising: receiving a bitstream for RF transmission, a symbol corresponding to the bitstream having a first value mapped to a first transmission power according to a modulation scheme; selecting a second value for the symbol based upon the second value mapping to a second transmission power that is lower than the first transmission power according to the modulation scheme; changing the symbol from the first value to the second value; and transmitting the bitstream wirelessly including transmitting the symbol using the second transmission power.

In Example 41, the subject matter of Example 40 includes, wherein the instructions further comprise applying an error correction code to the bitstream prior to changing the symbol.

In Example 42, the subject matter of Examples 40-41 includes, wherein the symbol is characterized by an amplitude and a phase shift and wherein the operations of changing the symbol from the first value to the second value comprises changing one or more of the amplitude or phase.

In Example 43, the subject matter of Examples 40-42 includes, wherein the symbol is characterized by a sequence of one or more bits and wherein the operations of changing the symbol from the first value to the second value comprises changing the bits in the sequence.

In Example 44, the subject matter of Examples 40-43 includes, wherein the second value is corrected back to the first value using an error correction code on a receiver.

In Example 45, the subject matter of Examples 40-44 includes, wherein the modulation scheme is a quadrature amplitude modulation scheme.

In Example 46, the subject matter of Examples 40-45 includes, wherein the operations further comprise: determining a number of symbols that can be corrected using an error correction code; determining a number of symbols to be changed based on the number of symbols that can be corrected; and changing a set of symbols in the bitstream, the set of symbols including the symbol and wherein a size of the set of symbols is based on the number of symbols to be changed.

In Example 47, the subject matter of Example 46 includes, wherein the operations of determining the number of symbols to be changed based upon the number of symbols that can be corrected comprises: determining an expected number of errors of a wireless channel upon which the bitstream is transmitted; and determining the number of symbols to be changed based upon the expected number of errors and the number of symbols that can be corrected using an error correction code.

In Example 48, the subject matter of Example 47 includes, wherein the operations of determining the expected number of errors comprises determining a number of symbols that were previously changed by conditions of a communication channel over which the bitstream was transmitted during previous transmissions.

In Example 49, the subject matter of Examples 40-48 includes, wherein the operations further comprise: identifying the symbol by applying a minimization function such that a peak transmission power of a plurality of symbols is minimized.

In Example 50, the subject matter of Examples 40-49 includes, wherein the operations further comprise: identifying a peak to average power level ratio of a transmitter that transmits the bitstream over a predetermined period of time; and identifying the symbol to produce a reduction to the peak to average power level ratio that is one of: a maximum reduction, or a reduction that is over a threshold reduction.

Example 51 is a machine-readable medium, storing instructions for wirelessly transmitting data using radio frequency waves, the instructions, when executed by a machine, cause the machine to perform operations comprising: receiving a bitstream for RF transmission, a symbol corresponding to the bitstream having a first value mapped to a first transmission power according to a modulation scheme; selecting a second value for the symbol based upon the second value mapping to a second transmission power that is lower than the first transmission power according to the modulation scheme; changing the symbol from the first value to the second value; and transmitting the bitstream wirelessly including transmitting the symbol using the second transmission power.

In Example 52, the subject matter of Example 51 includes, wherein the instructions further comprise applying an error correction code to the bitstream prior to changing the symbol.

In Example 53, the subject matter of Examples 51-52 includes, wherein the symbol is characterized by an amplitude and a phase shift and wherein the operations of changing the symbol from the first value to the second value comprises changing one or more of the amplitude or phase.

In Example 54, the subject matter of Examples 51-53 includes, wherein the symbol is characterized by a sequence of one or more bits and wherein the operations of changing the symbol from the first value to the second value comprises changing the bits in the sequence.

In Example 55, the subject matter of Examples 51-54 includes, wherein the second value is corrected back to the first value using an error correction code on a receiver.

In Example 56, the subject matter of Examples 51-55 includes, wherein the modulation scheme is a quadrature amplitude modulation scheme.

In Example 57, the subject matter of Examples 51-56 includes, wherein the operations further comprise: determining a number of symbols that can be corrected using an error correction code; determining a number of symbols to be changed based on the number of symbols that can be corrected; and changing a set of symbols in the bitstream, the set of symbols including the symbol and wherein a size of the set of symbols is based on the number of symbols to be changed.

In Example 58, the subject matter of Example 57 includes, wherein the operations of determining the number of symbols to be changed based upon the number of symbols that can be corrected comprises: determining an expected number of errors of a wireless channel upon which the bitstream is transmitted; and determining the number of symbols to be changed based upon the expected number of errors and the number of symbols that can be corrected using an error correction code.

In Example 59, the subject matter of Example 58 includes, wherein the operations of determining the expected number of errors comprises determining a number of symbols that were previously changed by conditions of a communication channel over which the bitstream was transmitted during previous transmissions.

In Example 60, the subject matter of Examples 51-59 includes, wherein the operations further comprise: identifying the symbol by applying a minimization function such that a peak transmission power of a plurality of symbols is minimized.

In Example 61, the subject matter of Examples 51-60 includes, wherein the operations further comprise: identifying a peak to average power level ratio of a transmitter that transmits the bitstream over a predetermined period of time; and identifying the symbol to produce a reduction to the peak to average power level ratio that is one of: a maximum reduction, or a reduction that is over a threshold reduction.

Example 62 is a device for wirelessly transmitting data using radio frequency waves, the device comprising: means for receiving a bitstream for RF transmission, a symbol corresponding to the bitstream having a first value mapped to a first transmission power according to a modulation scheme; means for selecting a second value for the symbol based upon the second value mapping to a second transmission power that is lower than the first transmission power according to the modulation scheme; means for changing the symbol from the first value to the second value; and means for transmitting the bitstream wirelessly including transmitting the symbol using the second transmission power.

In Example 63, the subject matter of Example 62 includes, wherein the device further comprises means for applying an error correction code to the bitstream prior to changing the symbol.

In Example 64, the subject matter of Examples 62-63 includes, wherein the symbol is characterized by an amplitude and a phase shift and wherein the means for changing the symbol from the first value to the second value comprises means for changing one or more of the amplitude or phase.

In Example 65, the subject matter of Examples 62-64 includes, wherein the symbol is characterized by a sequence of one or more bits and wherein the means for changing the symbol from the first value to the second value comprises means for changing the bits in the sequence.

In Example 66, the subject matter of Examples 62-65 includes, wherein the second value is corrected back to the first value using an error correction code on a receiver.

In Example 67, the subject matter of Examples 62-66 includes, wherein the modulation scheme is a quadrature amplitude modulation scheme.

In Example 68, the subject matter of Examples 62-67 includes, means for determining a number of symbols that can be corrected using an error correction code; means for determining a number of symbols to be changed based on the number of symbols that can be corrected; and means for changing a set of symbols in the bitstream, the set of symbols including the symbol and wherein a size of the set of symbols is based on the number of symbols to be changed.

In Example 69, the subject matter of Example 68 includes, wherein the means for determining the number of symbols to be changed based upon the number of symbols that can be corrected comprises: means for determining an expected number of errors of a wireless channel upon which the bitstream is transmitted; and means for determining the number of symbols to be changed based upon the expected number of errors and the number of symbols that can be corrected using an error correction code.

In Example 70, the subject matter of Example 69 includes, wherein the means for determining the expected number of errors comprises means for determining a number of symbols that were previously changed by conditions of a communication channel over which the bitstream was transmitted during previous transmissions.

In Example 71, the subject matter of Examples 62-70 includes, means for identifying the symbol by applying a minimization function such that a peak transmission power of a plurality of symbols is minimized.

In Example 72, the subject matter of Examples 62-71 includes, means for identifying a peak to average power level ratio of a transmitter that transmits the bitstream over a predetermined period of time; and means for identifying the symbol to produce a reduction to the peak to average power level ratio that is one of: a maximum reduction, or a reduction that is over a threshold reduction.

Example 73 is a method for transmitting data, the method comprising: receiving a bitstream for transmission; selecting two or more of a plurality of symbols corresponding to the bitstream such that a measure of spread of respective positions within the bitstream corresponding to the selected symbols meets a threshold; changing values of each of the selected symbols based upon an optimization goal that improves a communication metric relative to the communication metric prior to changing the values of each of the selected symbols; and transmitting the bitstream with the changed values over a communication network.

In Example 74, the subject matter of Example 73 includes, wherein the optimization goal includes a reduction in a peak to average power ratio of a transmission power over a period of time.

In Example 75, the subject matter of Example 74 includes, wherein the bitstream is transmitted according to a quadrature amplitude modulation scheme and wherein the changed value of each of the selected symbols comprises a value transmitted at a lower amplitude than an original value.

In Example 76, the subject matter of Examples 74-75 includes, wherein the bitstream is transmitted using an optical modulation scheme including power-based compression and wherein selecting two or more of the plurality of symbols of the bitstream comprises selecting at least a portion of a sequence of a number of repeated values, the sequence associated with a peak transmission power that is positively correlated with the number of the repeated values.

In Example 77, the subject matter of Examples 73-76 includes, wherein the optimization goal includes an error rate reduction.

In Example 78, the subject matter of Examples 73-77 includes, wherein the measure of spread comprises a minimum distance between respective selected symbols.

In Example 79, the subject matter of Examples 73-78 includes, wherein the measure of spread comprises an average distance between respective selected symbols.

In Example 80, the subject matter of Examples 73-79 includes, wherein the measure of spread comprises a variance of the selected symbols in the bitstream.

In Example 81, the subject matter of Examples 73-80 includes, wherein the plurality of symbols are characterized by respective amplitude and phase shifts and wherein changing the value of each of the selected symbols comprises changing one or more of the respective amplitudes or phase shifts of each of the selected symbols.

In Example 82, the subject matter of Examples 73-81 includes, wherein the plurality of symbols are sequences of one or more bits and wherein changing the value of each of the selected symbols comprises changing one or more bits in respective ones of the sequences.

In Example 83, the subject matter of Examples 73-82 includes, wherein an error correction code is applied to the bitstream prior to the changing of the values.

Example 84 is a device for transmitting data, the device comprising: a processor; a memory, storing instructions, which when executed by the processor, causes the processor to perform operations comprising: receiving a bitstream for transmission; selecting two or more of a plurality of symbols corresponding to the bitstream such that a measure of spread of respective positions within the bitstream corresponding to the selected symbols meets a threshold; changing values of each of the selected symbols based upon an optimization goal that improves a communication metric relative to the communication metric prior to changing the values of each of the selected symbols; and transmitting the bitstream with the changed values over a communication network.

In Example 85, the subject matter of Example 84 includes, wherein the optimization goal includes a reduction in a peak to average power ratio of a transmission power over a period of time.

In Example 86, the subject matter of Example 85 includes, wherein the bitstream is transmitted according to a quadrature amplitude modulation scheme and wherein the changed value of each of the selected symbols comprises a value transmitted at a lower amplitude than an original value.

In Example 87, the subject matter of Examples 85-86 includes, wherein the bitstream is transmitted using an optical modulation scheme including power-based compression and wherein the operations of selecting two or more of the plurality of symbols of the bitstream comprises selecting at least a portion of a sequence of a number of repeated values, the sequence associated with a peak transmission power that is positively correlated with the number of the repeated values.

In Example 88, the subject matter of Examples 84-87 includes, wherein the optimization goal includes an error rate reduction.

In Example 89, the subject matter of Examples 84-88 includes, wherein the measure of spread comprises a minimum distance between respective selected symbols.

In Example 90, the subject matter of Examples 84-89 includes, wherein the measure of spread comprises an average distance between respective selected symbols.

In Example 91, the subject matter of Examples 84-90 includes, wherein the measure of spread comprises a variance of the selected symbols in the bitstream.

In Example 92, the subject matter of Examples 84-91 includes, wherein the plurality of symbols are characterized by respective amplitude and phase shifts and wherein the operations of changing the value of each of the selected symbols comprises changing one or more of the respective amplitudes or phase shifts of each of the selected symbols.

In Example 93, the subject matter of Examples 84-92 includes, wherein the plurality of symbols are sequences of one or more bits and wherein the operations of changing the value of each of the selected symbols comprises changing one or more bits in respective ones of the sequences.

In Example 94, the subject matter of Examples 84-93 includes, wherein an error correction code is applied to the bitstream prior to the changing of the values.

Example 95 is a machine-readable medium, storing instructions for transmitting data, the instructions, when executed by a machine, cause the machine to perform operations comprising: receiving a bitstream for transmission; selecting two or more of a plurality of symbols corresponding to the bitstream such that a measure of spread of respective positions within the bitstream corresponding to the selected symbols meets a threshold; changing values of each of the selected symbols based upon an optimization goal that improves a communication metric relative to the communication metric prior to changing the values of each of the selected symbols; and transmitting the bitstream with the changed values over a communication network.

In Example 96, the subject matter of Example 95 includes, wherein the optimization goal includes a reduction in a peak to average power ratio of a transmission power over a period of time.

In Example 97, the subject matter of Example 96 includes, wherein the bitstream is transmitted according to a quadrature amplitude modulation scheme and wherein the changed value of each of the selected symbols comprises a value transmitted at a lower amplitude than an original value.

In Example 98, the subject matter of Examples 96-97 includes, wherein the bitstream is transmitted using an optical modulation scheme including power-based compression and wherein the operations of selecting two or more of the plurality of symbols of the bitstream comprises selecting at least a portion of a sequence of a number of repeated values, the sequence associated with a peak transmission power that is positively correlated with the number of the repeated values.

In Example 99, the subject matter of Examples 95-98 includes, wherein the optimization goal includes an error rate reduction.

In Example 100, the subject matter of Examples 95-99 includes, wherein the measure of spread comprises a minimum distance between respective selected symbols.

In Example 101, the subject matter of Examples 95-100 includes, wherein the measure of spread comprises an average distance between respective selected symbols.

In Example 102, the subject matter of Examples 95-101 includes, wherein the measure of spread comprises a variance of the selected symbols in the bitstream.

In Example 103, the subject matter of Examples 95-102 includes, wherein the plurality of symbols are characterized by respective amplitude and phase shifts and wherein the operations of changing the value of each of the selected symbols comprises changing one or more of the respective amplitudes or phase shifts of each of the selected symbols.

In Example 104, the subject matter of Examples 95-103 includes, wherein the plurality of symbols are sequences of one or more bits and wherein the operations of changing the value of each of the selected symbols comprises changing one or more bits in respective ones of the sequences.

In Example 105, the subject matter of Examples 95-104 includes, wherein an error correction code is applied to the bitstream prior to the changing of the values.

Example 106 is a device for transmitting data, the device comprising: means for receiving a bitstream for transmission; means for selecting two or more of a plurality of symbols corresponding to the bitstream such that a measure of spread of respective positions within the bitstream corresponding to the selected symbols meets a threshold; means for changing values of each of the selected symbols based upon an optimization goal that improves a communication metric relative to the communication metric prior to changing the values of each of the selected symbols; and means for transmitting the bitstream with the changed values over a communication network.

In Example 107, the subject matter of Example 106 includes, wherein the optimization goal includes a reduction in a peak to average power ratio of a transmission power over a period of time.

In Example 108, the subject matter of Example 107 includes, wherein the bitstream is transmitted according to a quadrature amplitude modulation scheme and wherein the changed value of each of the selected symbols comprises a value transmitted at a lower amplitude than an original value.

In Example 109, the subject matter of Examples 107-108 includes, wherein the bitstream is transmitted using an optical modulation scheme including power-based compression and wherein the means for selecting two or more of the plurality of symbols of the bitstream comprises means for selecting at least a portion of a sequence of a number of repeated values, the sequence associated with a peak transmission power that is positively correlated with the number of the repeated values.

In Example 110, the subject matter of Examples 106-109 includes, wherein the optimization goal includes an error rate reduction.

In Example 111, the subject matter of Examples 106-110 includes, wherein the measure of spread comprises a minimum distance between respective selected symbols.

In Example 112, the subject matter of Examples 106-111 includes, wherein the measure of spread comprises an average distance between respective selected symbols.

In Example 113, the subject matter of Examples 106-112 includes, wherein the measure of spread comprises a variance of the selected symbols in the bitstream.

In Example 114, the subject matter of Examples 106-113 includes, wherein the plurality of symbols are characterized by respective amplitude and phase shifts and wherein the means for changing the value of each of the selected symbols comprises means for changing one or more of the respective amplitudes or phase shifts of each of the selected symbols.

In Example 115, the subject matter of Examples 106-114 includes, wherein the plurality of symbols are sequences of one or more bits and wherein the means for changing the value of each of the selected symbols comprises means for changing one or more bits in respective ones of the sequences.

In Example 116, the subject matter of Examples 106-115 includes, wherein an error correction code is applied to the bitstream prior to the changing of the values.

Example 117 is a method for transmitting data, the method comprising: receiving a bitstream for transmission; selecting a first symbol corresponding to the bitstream having a first value, the first symbol selected based upon having an adjacent, second symbol corresponding to the bitstream with a second value that is not a same value as the first value, the second value mapped under a modulation scheme to a second constellation point that is within a threshold distance of a first constellation point that the first value is mapped to under the modulation scheme; changing the first symbol from the first value to a third value such that the second constellation point is not within the threshold distance of a third constellation point that the third value is mapped to under the modulation scheme; and transmitting the bitstream, including transmitting the third value instead of the first value for the first symbol.

In Example 118, the subject matter of Example 117 includes, wherein the third value of the first symbol is corrected back to the first value using an error correction code on a receiver.

In Example 119, the subject matter of Examples 117-118 includes, wherein the modulation scheme is a quadrature amplitude modulation scheme.

In Example 120, the subject matter of Examples 117-119 includes, determining a number of symbols that can be corrected using an error correction code; determining a number of symbols to be changed based on the number of symbols that can be corrected; and changing a set of symbols in the bitstream, the set of symbols including the first symbol and a size of the set of symbols based on the number of symbols to be changed.

In Example 121, the subject matter of Example 120 includes, wherein determining the number of symbols that can be changed based upon the number of symbols that can be corrected comprises: determining an expected number of errors using a bit-error rate of a wireless channel upon which the bitstream is transmitted; and determining the number of symbols that can be changed based upon the expected number of errors and the number of symbols that can be corrected using the error correction code.

In Example 122, the subject matter of Example 121 includes, wherein determining the expected number of errors comprises determining a number of symbols that were previously changed by a communication channel on which the transmitted bits are transmitted during a previous transmission on the communication channel.

In Example 123, the subject matter of Examples 117-122 includes, wherein the first symbol is characterized by an amplitude and a phase shift and wherein changing the first symbol to the third value such that the second constellation point is not within the threshold distance of the third constellation point that the third value is modulated to under the modulation scheme comprises changing one or more of the amplitude or phase.

In Example 124, the subject matter of Examples 117-123 includes, wherein the first symbol is a sequence of one or more bits and wherein changing the first symbol to the third value such that the second constellation point is not within the threshold distance of the third constellation point that the third value is modulated to under the modulation scheme comprises changing one or more of the bits in the sequence.

In Example 125, the subject matter of Examples 117-124 includes, applying an error correction code to the bitstream prior to changing the first symbol.

Example 126 is a device for transmitting data, the device comprising: a processor; a memory, the memory storing instructions, which when executed by the processor, causes the processor to perform operations comprising: receiving a bitstream for transmission; selecting a first symbol corresponding to the bitstream having a first value, the first symbol selected based upon having an adjacent, second symbol corresponding to the bitstream with a second value that is not a same value as the first value, the second value mapped under a modulation scheme to a second constellation point that is within a threshold distance of a first constellation point that the first value is mapped to under the modulation scheme; changing the first symbol from the first value to a third value such that the second constellation point is not within the threshold distance of a third constellation point that the third value is mapped to under the modulation scheme; and transmitting the bitstream, including transmitting the third value instead of the first value for the first symbol.

In Example 127, the subject matter of Example 126 includes, wherein the third value of the first symbol is corrected back to the first value using an error correction code on a receiver.

In Example 128, the subject matter of Examples 126-127 includes, wherein the modulation scheme is a quadrature amplitude modulation scheme.

In Example 129, the subject matter of Examples 126-128 includes, wherein the operations further comprise: determining a number of symbols that can be corrected using an error correction code; determining a number of symbols to be changed based on the number of symbols that can be corrected; and changing a set of symbols in the bitstream, the set of symbols including the first symbol and a size of the set of symbols based on the number of symbols to be changed.

In Example 130, the subject matter of Example 129 includes, wherein the operations of determining the number of symbols that can be changed based upon the number of symbols that can be corrected comprises: determining an expected number of errors using a bit-error rate of a wireless channel upon which the bitstream is transmitted; and determining the number of symbols that can be changed based upon the expected number of errors and the number of symbols that can be corrected using the error correction code.

In Example 131, the subject matter of Example 130 includes, wherein the operations of determining the expected number of errors comprises determining a number of symbols that were previously changed by a communication channel on which the transmitted bits are transmitted during a previous transmission on the communication channel.

In Example 132, the subject matter of Examples 126-131 includes, wherein the first symbol is characterized by an amplitude and a phase shift and wherein the operations of changing the first symbol to the third value such that the second constellation point is not within the threshold distance of the third constellation point that the third value is modulated to under the modulation scheme comprises changing one or more of the amplitude or phase.

In Example 133, the subject matter of Examples 126-132 includes, wherein the first symbol is a sequence of one or more bits and wherein the operations of changing the first symbol to the third value such that the second constellation point is not within the threshold distance of the third constellation point that the third value is modulated to under the modulation scheme comprises changing one or more of the bits in the sequence.

In Example 134, the subject matter of Examples 126-133 includes, wherein the operations further comprise applying an error correction code to the bitstream prior to changing the first symbol.

Example 135 is a machine-readable medium, storing instructions for transmitting data, the instructions, when executed by a machine, cause the machine to perform operations comprising: receiving a bitstream for transmission; selecting a first symbol corresponding to the bitstream having a first value, the first symbol selected based upon having an adjacent, second symbol corresponding to the bitstream with a second value that is not a same value as the first value, the second value mapped under a modulation scheme to a second constellation point that is within a threshold distance of a first constellation point that the first value is mapped to under the modulation scheme; changing the first symbol from the first value to a third value such that the second constellation point is not within the threshold distance of a third constellation point that the third value is mapped to under the modulation scheme; and transmitting the bitstream, including transmitting the third value instead of the first value for the first symbol.

In Example 136, the subject matter of Example 135 includes, wherein the third value of the first symbol is corrected back to the first value using an error correction code on a receiver.

In Example 137, the subject matter of Examples 135-136 includes, wherein the modulation scheme is a quadrature amplitude modulation scheme.

In Example 138, the subject matter of Examples 135-137 includes, wherein the operations further comprise: determining a number of symbols that can be corrected using an error correction code; determining a number of symbols to be changed based on the number of symbols that can be corrected; and changing a set of symbols in the bitstream, the set of symbols including the first symbol and a size of the set of symbols based on the number of symbols to be changed.

In Example 139, the subject matter of Example 138 includes, wherein the operations of determining the number of symbols that can be changed based upon the number of symbols that can be corrected comprises: determining an expected number of errors using a bit-error rate of a wireless channel upon which the bitstream is transmitted; and determining the number of symbols that can be changed based upon the expected number of errors and the number of symbols that can be corrected using the error correction code.

In Example 140, the subject matter of Example 139 includes, wherein the operations of determining the expected number of errors comprises determining a number of symbols that were previously changed by a communication channel on which the transmitted bits are transmitted during a previous transmission on the communication channel.

In Example 141, the subject matter of Examples 135-140 includes, wherein the first symbol is characterized by an amplitude and a phase shift and wherein the operations of changing the first symbol to the third value such that the second constellation point is not within the threshold distance of the third constellation point that the third value is modulated to under the modulation scheme comprises changing one or more of the amplitude or phase.

In Example 142, the subject matter of Examples 135-141 includes, wherein the first symbol is a sequence of one or more bits and wherein the operations of changing the first symbol to the third value such that the second constellation point is not within the threshold distance of the third constellation point that the third value is modulated to under the modulation scheme comprises changing one or more of the bits in the sequence.

In Example 143, the subject matter of Examples 135-142 includes, wherein the operations further comprise applying an error correction code to the bitstream prior to changing the first symbol.

Example 144 is a device for transmitting data, the device comprising: means for receiving a bitstream for transmission; means for selecting a first symbol corresponding to the bitstream having a first value, the first symbol selected based upon having an adjacent, second symbol corresponding to the bitstream with a second value that is not a same value as the first value, the second value mapped under a modulation scheme to a second constellation point that is within a threshold distance of a first constellation point that the first value is mapped to under the modulation scheme; means for changing the first symbol from the first value to a third value such that the second constellation point is not within the threshold distance of a third constellation point that the third value is mapped to under the modulation scheme; and means for transmitting the bitstream, including transmitting the third value instead of the first value for the first symbol.

In Example 145, the subject matter of Example 144 includes, wherein the third value of the first symbol is corrected back to the first value using an error correction code on a receiver.

In Example 146, the subject matter of Examples 144-145 includes, wherein the modulation scheme is a quadrature amplitude modulation scheme.

In Example 147, the subject matter of Examples 144-146 includes, means for determining a number of symbols that can be corrected using an error correction code; means for determining a number of symbols to be changed based on the number of symbols that can be corrected; and means for changing a set of symbols in the bitstream, the set of symbols including the first symbol and a size of the set of symbols based on the number of symbols to be changed.

In Example 148, the subject matter of Example 147 includes, wherein the means for determining the number of symbols that can be changed based upon the number of symbols that can be corrected comprises: means for determining an expected number of errors using a bit-error rate of a wireless channel upon which the bitstream is transmitted; and means for determining the number of symbols that can be changed based upon the expected number of errors and the number of symbols that can be corrected using the error correction code.

In Example 149, the subject matter of Example 148 includes, wherein the means for determining the expected number of errors comprises means for determining a number of symbols that were previously changed by a communication channel on which the transmitted bits are transmitted during a previous transmission on the communication channel.

In Example 150, the subject matter of Examples 144-149 includes, wherein the first symbol is characterized by an amplitude and a phase shift and wherein the means for changing the first symbol to the third value such that the second constellation point is not within the threshold distance of the third constellation point that the third value is modulated to under the modulation scheme comprises means for changing one or more of the amplitude or phase.

In Example 151, the subject matter of Examples 144-150 includes, wherein the first symbol is a sequence of one or more bits and wherein the means for changing the first symbol to the third value such that the second constellation point is not within the threshold distance of the third constellation point that the third value is modulated to under the modulation scheme comprises means for changing one or more of the bits in the sequence.

In Example 152, the subject matter of Examples 144-151 includes, applying an error correction code to the bitstream prior to changing the first symbol.

Example 153 is a method for transmitting data by a device, the method comprising: receiving a bitstream for transmission, the bitstream including a plurality of symbols; determining optimization data comprising one or more of: a communication metric of a communication channel that the bitstream is transmitted across or a device context of the device, the device context comprising an operating characteristic of the device; selecting a first optimization goal from a plurality of optimization goals based upon the optimization data; changing a value of a first symbol from a first value to a second value, the first symbol selected and changed to the second value to achieve the first optimization goal; transmitting the first symbol at the second value; updating the optimization data after transmitting the first symbol; selecting a second optimization goal from the plurality of optimization goals that is different than the first optimization goal in response to the updated optimization data; changing a value of a second symbol from a third value to a fourth value, the second symbol selected and changed to the fourth value to achieve the second optimization goal; and transmitting the second symbol at the fourth value.

In Example 154, the subject matter of Example 153 includes, wherein the device context comprises one or more of: a battery level of the device, a communication state of the device, or a quality of service characteristic of the bitstream.

In Example 155, the subject matter of Examples 153-154 includes, wherein the communication metric comprises one or more of: an error rate, a received signal strength, or a signal quality.

In Example 156, the subject matter of Examples 153-155 includes, wherein selecting an optimization goal from the plurality of optimization goals comprises applying the optimization data to a decision tree.

In Example 157, the subject matter of Examples 153-156 includes, wherein selecting an optimization goal from the plurality of optimization goals comprises applying the optimization data to a supervised learning machine-learned model, the supervised learning machine-learned model previously trained with a training set of optimization data labeled with a target optimization goal.

In Example 158, the subject matter of Examples 153-157 includes, wherein selecting the first optimization goal comprises selecting a peak-to-average power level optimization and wherein changing the value of the first symbol from the first value to the second value to achieve the first optimization goal comprises changing the first symbol such that a power level of the first symbol is decreased according to a symbol to power-level mapping of a modulation scheme.

In Example 159, the subject matter of Examples 153-158 includes, wherein selecting the first optimization goal comprises selecting a bit error reduction optimization and wherein changing the value of the first symbol from the first value to the second value to achieve the first optimization goal comprises changing the first symbol such that a respective constellation point of the first symbol according to a modulation scheme is greater than a threshold distance from a constellation point of a neighboring symbol.

In Example 160, the subject matter of Examples 153-159 includes, wherein values of the first and second symbols are corrected using an error correction code on a receiver.

In Example 161, the subject matter of Examples 153-160 includes, wherein the first value and the third value are a same value.

In Example 162, the subject matter of Examples 153-161 includes, wherein the second and fourth value are a same value.

In Example 163, the subject matter of Examples 153-162 includes, wherein the first symbol is characterized by an amplitude and a phase shift, and wherein changing the first symbol from the first value to the second value comprises changing one or more of the amplitude or phase.

In Example 164, the subject matter of Examples 153-163 includes, wherein the first symbol is a sequence of one or more bits and wherein changing the first symbol from the first value to the second value comprises changing one or more bits in the sequence.

Example 165 is a device for transmitting data, the device comprising: a processor; a memory, the memory storing instructions, which when executed by the processor cause the processor to perform operations comprising: receiving a bitstream for transmission, the bitstream including a plurality of symbols; determining optimization data comprising one or more of: a communication metric of a communication channel that the bitstream is transmitted across or a device context of the device, the device context comprising an operating characteristic of the device; selecting a first optimization goal from a plurality of optimization goals based upon the optimization data; changing a value of a first symbol from a first value to a second value, the first symbol selected and changed to the second value to achieve the first optimization goal; transmitting the first symbol at the second value; updating the optimization data after transmitting the first symbol; selecting a second optimization goal from the plurality of optimization goals that is different than the first optimization goal in response to the updated optimization data; changing a value of a second symbol from a third value to a fourth value, the second symbol selected and changed to the fourth value to achieve the second optimization goal; and transmitting the second symbol at the fourth value.

In Example 166, the subject matter of Example 165 includes, wherein the device context comprises one or more of: a battery level of the device, a communication state of the device, or a quality of service characteristic of the bitstream.

In Example 167, the subject matter of Examples 165-166 includes, wherein the communication metric comprises one or more of: an error rate, a received signal strength, or a signal quality.

In Example 168, the subject matter of Examples 165-167 includes, wherein the operations of selecting an optimization goal from the plurality of optimization goals comprises applying the optimization data to a decision tree.

In Example 169, the subject matter of Examples 165-168 includes, wherein the operations of selecting an optimization goal from the plurality of optimization goals comprises applying the optimization data to a supervised learning machine-learned model, the supervised learning machine-learned model previously trained with a training set of optimization data labeled with a target optimization goal.

In Example 170, the subject matter of Examples 165-169 includes, wherein the operations of selecting the first optimization goal comprises selecting a peak-to-average power level optimization and wherein the operations of changing the value of the first symbol from the first value to the second value to achieve the first optimization goal comprises changing the first symbol such that a power level of the first symbol is decreased according to a symbol to power-level mapping of a modulation scheme.

In Example 171, the subject matter of Examples 165-170 includes, wherein the operations of selecting the first optimization goal comprises selecting a bit error reduction optimization and wherein the operations of changing the value of the first symbol from the first value to the second value to achieve the first optimization goal comprises changing the first symbol such that a respective constellation point of the first symbol according to a modulation scheme is greater than a threshold distance from a constellation point of a neighboring symbol.

In Example 172, the subject matter of Examples 165-171 includes, wherein values of the first and second symbols are corrected using an error correction code on a receiver.

In Example 173, the subject matter of Examples 165-172 includes, wherein the first value and the third value are a same value.

In Example 174, the subject matter of Examples 165-173 includes, wherein the second and fourth value are a same value.

In Example 175, the subject matter of Examples 165-174 includes, wherein the first symbol is characterized by an amplitude and a phase shift, and wherein the operations of changing the first symbol from the first value to the second value comprises changing one or more of the amplitude or phase.

In Example 176, the subject matter of Examples 165-175 includes, wherein the first symbol is a sequence of one or more bits and wherein the operations of changing the first symbol from the first value to the second value comprises changing one or more bits in the sequence.

Example 177 is a machine-readable medium, storing instructions, which when executed by a machine cause the machine to perform operations comprising: receiving a bitstream for transmission, the bitstream including a plurality of symbols; determining optimization data comprising one or more of: a communication metric of a communication channel that the bitstream is transmitted across or a device context of the machine, the device context comprising an operating characteristic of the machine; selecting a first optimization goal from a plurality of optimization goals based upon the optimization data; changing a value of a first symbol from a first value to a second value, the first symbol selected and changed to the second value to achieve the first optimization goal; transmitting the first symbol at the second value; updating the optimization data after transmitting the first symbol; selecting a second optimization goal from the plurality of optimization goals that is different than the first optimization goal in response to the updated optimization data; changing a value of a second symbol from a third value to a fourth value, the second symbol selected and changed to the fourth value to achieve the second optimization goal; and transmitting the second symbol at the fourth value.

In Example 178, the subject matter of Example 177 includes, wherein the device context comprises one or more of: a battery level of the machine, a communication state of the machine, or a quality of service characteristic of the bitstream.

In Example 179, the subject matter of Examples 177-178 includes, wherein the communication metric comprises one or more of: an error rate, a received signal strength, or a signal quality.

In Example 180, the subject matter of Examples 177-179 includes, wherein the operations of selecting an optimization goal from the plurality of optimization goals comprises applying the optimization data to a decision tree.

In Example 181, the subject matter of Examples 177-180 includes, wherein the operations of selecting an optimization goal from the plurality of optimization goals comprises applying the optimization data to a supervised learning machine-learned model, the supervised learning machine-learned model previously trained with a training set of optimization data labeled with a target optimization goal.

In Example 182, the subject matter of Examples 177-181 includes, wherein the operations of selecting the first optimization goal comprises selecting a peak-to-average power level optimization and wherein the operations of changing the value of the first symbol from the first value to the second value to achieve the first optimization goal comprises changing the first symbol such that a power level of the first symbol is decreased according to a symbol to power-level mapping of a modulation scheme.

In Example 183, the subject matter of Examples 177-182 includes, wherein the operations of selecting the first optimization goal comprises selecting a bit error reduction optimization and wherein the operations of changing the value of the first symbol from the first value to the second value to achieve the first optimization goal comprises changing the first symbol such that a respective constellation point of the first symbol according to a modulation scheme is greater than a threshold distance from a constellation point of a neighboring symbol.

In Example 184, the subject matter of Examples 177-183 includes, wherein values of the first and second symbols are corrected using an error correction code on a receiver.

In Example 185, the subject matter of Examples 177-184 includes, wherein the first value and the third value are a same value.

In Example 186, the subject matter of Examples 177-185 includes, wherein the second and fourth value are a same value.

In Example 187, the subject matter of Examples 177-186 includes, wherein the first symbol is characterized by an amplitude and a phase shift, and wherein the operations of changing the first symbol from the first value to the second value comprises changing one or more of the amplitude or phase.

In Example 188, the subject matter of Examples 177-187 includes, wherein the first symbol is a sequence of one or more bits and wherein the operations of changing the first symbol from the first value to the second value comprises changing one or more bits in the sequence.

Example 189 is a device for transmitting data, the device comprising: means for receiving a bitstream for transmission, the bitstream including a plurality of symbols; means for determining optimization data comprising one or more of: a communication metric of a communication channel that the bitstream is transmitted across or a device context of the device, the device context comprising an operating characteristic of the device; means for selecting a first optimization goal from a plurality of optimization goals based upon the optimization data; means for changing a value of a first symbol from a first value to a second value, the first symbol selected and changed to the second value to achieve the first optimization goal; means for transmitting the first symbol at the second value; means for updating the optimization data after transmitting the first symbol; means for selecting a second optimization goal from the plurality of optimization goals that is different than the first optimization goal in response to the updated optimization data; means for changing a value of a second symbol from a third value to a fourth value, the second symbol selected and changed to the fourth value to achieve the second optimization goal; and means for transmitting the second symbol at the fourth value.

In Example 190, the subject matter of Example 189 includes, wherein the device context comprises one or more of: a battery level of the device, a communication state of the device, or a quality of service characteristic of the bitstream.

In Example 191, the subject matter of Examples 189-190 includes, wherein the communication metric comprises one or more of: an error rate, a received signal strength, or a signal quality.

In Example 192, the subject matter of Examples 189-191 includes, wherein the means for selecting an optimization goal from the plurality of optimization goals comprises applying the optimization data to a decision tree.

In Example 193, the subject matter of Examples 189-192 includes, wherein the means for selecting an optimization goal from the plurality of optimization goals comprises means for applying the optimization data to a supervised learning machine-learned model, the supervised learning machine-learned model previously trained with a training set of optimization data labeled with a target optimization goal.

In Example 194, the subject matter of Examples 189-193 includes, wherein the means for selecting the first optimization goal comprises means for selecting a peak-to-average power level optimization and wherein the means for changing the value of the first symbol from the first value to the second value to achieve the first optimization goal comprises means for changing the first symbol such that a power level of the first symbol is decreased according to a symbol to power-level mapping of a modulation scheme.

In Example 195, the subject matter of Examples 189-194 includes, wherein the means for selecting the first optimization goal comprises means for selecting a bit error reduction optimization and wherein the means for changing the value of the first symbol from the first value to the second value to achieve the first optimization goal comprises means for changing the first symbol such that a respective constellation point of the first symbol according to a modulation scheme is greater than a threshold distance from a constellation point of a neighboring symbol.

In Example 196, the subject matter of Examples 189-195 includes, wherein values of the first and second symbols are corrected using an error correction code on a receiver.

In Example 197, the subject matter of Examples 189-196 includes, wherein the first value and the third value are a same value.

In Example 198, the subject matter of Examples 189-197 includes, wherein the second and fourth value are a same value.

In Example 199, the subject matter of Examples 189-198 includes, wherein the first symbol is characterized by an amplitude and a phase shift, and wherein the means for changing the first symbol from the first value to the second value comprises means for changing one or more of the amplitude or phase.

In Example 200, the subject matter of Examples 189-199 includes, wherein the first symbol is a sequence of one or more bits and wherein the means for changing the first symbol from the first value to the second value comprises means for changing one or more bits in the sequence.

Example 201 is a method for transmitting data, the method comprising: receiving a bitstream for transmission; increasing an average power level of a transmitter for transmission of a portion of the bitstream on a channel, the increased average power level greater than an average power level specified by a communication protocol for transmitting the portion of the bitstream given a current communication channel condition; determining a first number of symbols corresponding to the portion of the bitstream to be changed, the first number determined based upon a communication metric resulting from the increase in average power level, the first number of symbols more than a second number of symbols that would be changed based upon the communication metric prior to the increase; selecting the first number of symbols in the portion of the bitstream and changing a value of each of the selected first number of symbols; and transmitting the bitstream using the increased average power level.

In Example 202, the subject matter of Example 201 includes, applying an error correction code prior to changing a value of each of the selected first number of symbols.

In Example 203, the subject matter of Examples 201-202 includes, wherein selecting the first number of symbols of the bitstream and changing the value of each of the selected first number of symbols comprises selecting the first number of symbols corresponding to the bitstream and changing the value of each of the selected first number of symbols such that a respective power level of each of the selected first number of symbols are decreased according to a mapping corresponding to a modulation scheme.

In Example 204, the subject matter of Example 203 includes, wherein a modulation scheme used in transmitting the bitstream is a quadrature amplitude modulation scheme and wherein changing the value of each of the selected first number of symbols comprises changing the value from a first constellation symbol associated with a first amplitude to a second constellation symbol associated with a second amplitude, the second amplitude less than the first amplitude.

In Example 205, the subject matter of Examples 203-204 includes, wherein a modulation scheme used in transmitting the bitstream is an optical modulation scheme including power-based compression and wherein selecting the first number of symbols of the bitstream and changing the value of each of the selected first number of symbols comprises: determining that the bitstream includes a sequence of a first number of a repeated consecutive values, the sequence associated with a first peak transmission power that is correlated with the first number of the repeated consecutive values; and changing a selected value in the first number of repeated consecutive values to a second value.

In Example 206, the subject matter of Examples 201-205 includes, wherein selecting the first number of symbols of the bitstream comprises selecting ones of the first number of symbols of the bitstream that are mapped to constellation points that are less than a threshold distance from a constellation point that a preceding or successive symbol in the bitstream is mapped to; and wherein changing the value of each of the selected first number of symbols comprises changing the ones of the first number of symbols to symbols that exceed the threshold distance from constellation points that the preceding and successive symbols in the bitstream are mapped to.

In Example 207, the subject matter of Examples 201-206 includes, wherein the communication metric comprises a bit error rate of for previous communications on the channel; and wherein increasing the average power level of the transmitter decreases the bit error rate of the communications on the channel.

In Example 208, the subject matter of Examples 201-207 includes, wherein the communication metric comprises a signal-to-noise ratio; and wherein increasing the average power level of the transmitter increases the signal-to-noise ratio of a recipient device.

In Example 209, the subject matter of Examples 201-208 includes, wherein a symbol comprises one or more bits that are modulated onto a carrier wave.

In Example 210, the subject matter of Examples 201-209 includes, wherein values of the first number of symbols are corrected using an error correction code on a receiver.

In Example 211, the subject matter of Examples 201-210 includes, wherein symbols of the first number of symbols are characterized by respective amplitude and phase shifts and wherein changing the value of each of the selected first number of symbols comprises changing one or more of the amplitude or phase of each of the selected first number of symbols.

In Example 212, the subject matter of Examples 201-211 includes, wherein symbols of the first number of symbols are sequences of one or more bits and wherein changing the value of each of the selected first number of symbols comprises changing one or more bits of the selected first number of symbols.

In Example 213, the subject matter of Examples 201-212 includes, determining a target number of symbols to be changed; determining a target average power level increase based upon the target number of symbols to be changed; and wherein increasing the average power level of a transmitter for transmission of the portion of the bitstream on the channel comprises increasing the average power level to the target average power level.

Example 214 is a device for transmitting data, the device comprising: a processor; a memory, storing instructions, which when executed by the processor, causes the processor to perform operations comprising: receiving a bitstream for transmission; increasing an average power level of a transmitter for transmission of a portion of the bitstream on a channel, the increased average power level greater than an average power level specified by a communication protocol for transmitting the portion of the bitstream given a current communication channel condition; determining a first number of symbols corresponding to the portion of the bitstream to be changed, the first number determined based upon a communication metric resulting from the increase in average power level, the first number of symbols more than a second number of symbols that would be changed based upon the communication metric prior to the increase; selecting the first number of symbols in the portion of the bitstream and changing a value of each of the selected first number of symbols; and transmitting the bitstream using the increased average power level.

In Example 215, the subject matter of Example 214 includes, wherein the operations further comprise applying an error correction code prior to changing a value of each of the selected first number of symbols.

In Example 216, the subject matter of Examples 214-215 includes, wherein the operations of selecting the first number of symbols of the bitstream and changing the value of each of the selected first number of symbols comprises selecting the first number of symbols corresponding to the bitstream and changing the value of each of the selected first number of symbols such that a respective power level of each of the selected first number of symbols are decreased according to a mapping corresponding to a modulation scheme.

In Example 217, the subject matter of Example 216 includes, wherein a modulation scheme used in transmitting the bitstream is a quadrature amplitude modulation scheme and wherein the operations of changing the value of each of the selected first number of symbols comprises changing the value from a first constellation symbol associated with a first amplitude to a second constellation symbol associated with a second amplitude, the second amplitude less than the first amplitude.

In Example 218, the subject matter of Examples 216-217 includes, wherein a modulation scheme used in transmitting the bitstream is an optical modulation scheme including power-based compression and wherein the operations of selecting the first number of symbols of the bitstream and changing the value of each of the selected first number of symbols comprises: determining that the bitstream includes a sequence of a first number of a repeated consecutive values, the sequence associated with a first peak transmission power that is correlated with the first number of the repeated consecutive values; and changing a selected value in the first number of repeated consecutive values to a second value.

In Example 219, the subject matter of Examples 214-218 includes, wherein the operations of selecting the first number of symbols of the bitstream comprises selecting ones of the first number of symbols of the bitstream that are mapped to constellation points that are less than a threshold distance from a constellation point that a preceding or successive symbol in the bitstream is mapped to; and wherein the operations of changing the value of each of the selected first number of symbols comprises changing the ones of the first number of symbols to symbols that exceed the threshold distance from constellation points that the preceding and successive symbols in the bitstream are mapped to.

In Example 220, the subject matter of Examples 214-219 includes, wherein the communication metric comprises a bit error rate of for previous communications on the channel; and wherein the operations of increasing the average power level of the transmitter decreases the bit error rate of the communications on the channel.

In Example 221, the subject matter of Examples 214-220 includes, wherein the communication metric comprises a signal-to-noise ratio; and wherein the operations of increasing the average power level of the transmitter increases the signal-to-noise ratio of a recipient device.

In Example 222, the subject matter of Examples 214-221 includes, wherein a symbol comprises one or more bits that are modulated onto a carrier wave.

In Example 223, the subject matter of Examples 214-222 includes, wherein values of the first number of symbols are corrected using an error correction code on a receiver.

In Example 224, the subject matter of Examples 214-223 includes, wherein symbols of the first number of symbols are characterized by respective amplitude and phase shifts and wherein the operations of changing the value of each of the selected first number of symbols comprises changing one or more of the amplitude or phase of each of the selected first number of symbols.

In Example 225, the subject matter of Examples 214-224 includes, wherein symbols of the first number of symbols are characterized by sequences of one or more bits and wherein the operations of changing the value of each of the selected first number of symbols comprises changing one or more bits of the selected first number of symbols.

In Example 226, the subject matter of Examples 214-225 includes, wherein the operations further comprise: determining a target number of symbols to be changed; determining a target average power level increase based upon the target number of symbols to be changed; and wherein increasing the average power level of a transmitter for transmission of the portion of the bitstream on the channel comprises increasing the average power level to the target average power level.

Example 227 is a machine-readable medium, storing instructions for transmitting data, the instructions, when executed by a machine, cause the machine to perform operations comprising: receiving a bitstream for transmission; increasing an average power level of a transmitter for transmission of a portion of the bitstream on a channel, the increased average power level greater than an average power level specified by a communication protocol for transmitting the portion of the bitstream given a current communication channel condition; determining a first number of symbols corresponding to the portion of the bitstream to be changed, the first number determined based upon a communication metric resulting from the increase in average power level, the first number of symbols more than a second number of symbols that would be changed based upon the communication metric prior to the increase; selecting the first number of symbols in the portion of the bitstream and changing a value of each of the selected first number of symbols; and transmitting the bitstream using the increased average power level.

In Example 228, the subject matter of Example 227 includes, wherein the operations further comprise applying an error correction code prior to changing a value of each of the selected first number of symbols.

In Example 229, the subject matter of Examples 227-228 includes, wherein the operations of selecting the first number of symbols of the bitstream and changing the value of each of the selected first number of symbols comprises selecting the first number of symbols corresponding to the bitstream and changing the value of each of the selected first number of symbols such that a respective power level of each of the selected first number of symbols are decreased according to a mapping corresponding to a modulation scheme.

In Example 230, the subject matter of Example 229 includes, wherein a modulation scheme used in transmitting the bitstream is a quadrature amplitude modulation scheme and wherein the operations of changing the value of each of the selected first number of symbols comprises changing the value from a first constellation symbol associated with a first amplitude to a second constellation symbol associated with a second amplitude, the second amplitude less than the first amplitude.

In Example 231, the subject matter of Examples 229-230 includes, wherein a modulation scheme used in transmitting the bitstream is an optical modulation scheme including power-based compression and wherein the operations of selecting the first number of symbols of the bitstream and changing the value of each of the selected first number of symbols comprises: determining that the bitstream includes a sequence of a first number of a repeated consecutive values, the sequence associated with a first peak transmission power that is correlated with the first number of the repeated consecutive values; and changing a selected value in the first number of repeated consecutive values to a second value.

In Example 232, the subject matter of Examples 227-231 includes, wherein the operations of selecting the first number of symbols of the bitstream comprises selecting ones of the first number of symbols of the bitstream that are mapped to constellation points that are less than a threshold distance from a constellation point that a preceding or successive symbol in the bitstream is mapped to; and wherein the operations of changing the value of each of the selected first number of symbols comprises changing the ones of the first number of symbols to symbols that exceed the threshold distance from constellation points that the preceding and successive symbols in the bitstream are mapped to.

In Example 233, the subject matter of Examples 227-232 includes, wherein the communication metric comprises a bit error rate of for previous communications on the channel; and wherein the operations of increasing the average power level of the transmitter decreases the bit error rate of the communications on the channel.

In Example 234, the subject matter of Examples 227-233 includes, wherein the communication metric comprises a signal-to-noise ratio; and wherein the operations of increasing the average power level of the transmitter increases the signal-to-noise ratio of a recipient device.

In Example 235, the subject matter of Examples 227-234 includes, wherein a symbol comprises one or more bits that are modulated onto a carrier wave.

In Example 236, the subject matter of Examples 227-235 includes, wherein values of the first number of symbols are corrected using an error correction code on a receiver.

In Example 237, the subject matter of Examples 227-236 includes, wherein symbols of the first number of symbols are characterized by respective amplitude and phase shifts and wherein the operations of changing the value of each of the selected first number of symbols comprises changing one or more of the amplitude or phase of each of the selected first number of symbols.

In Example 238, the subject matter of Examples 227-237 includes, wherein symbols of the first number of symbols are characterized by sequences of one or more bits and wherein the operations of changing the value of each of the selected first number of symbols comprises changing one or more bits of the selected first number of symbols.

In Example 239, the subject matter of Examples 227-238 includes, wherein the operations further comprise: determining a target number of symbols to be changed; determining a target average power level increase based upon the target number of symbols to be changed; and wherein increasing the average power level of a transmitter for transmission of the portion of the bitstream on the channel comprises increasing the average power level to the target average power level.

Example 240 is a device for transmitting data, the device comprising: means for receiving a bitstream for transmission; means for increasing an average power level of a transmitter for transmission of a portion of the bitstream on a channel, the increased average power level greater than an average power level specified by a communication protocol for transmitting the portion of the bitstream given a current communication channel condition; means for determining a first number of symbols corresponding to the portion of the bitstream to be changed, the first number determined based upon a communication metric resulting from the increase in average power level, the first number of symbols more than a second number of symbols that would be changed based upon the communication metric prior to the increase; means for selecting the first number of symbols in the portion of the bitstream and changing a value of each of the selected first number of symbols; and means for transmitting the bitstream using the increased average power level.

In Example 241, the subject matter of Example 240 includes, means for applying an error correction code prior to changing a value of each of the selected first number of symbols.

In Example 242, the subject matter of Examples 240-241 includes, wherein the means for selecting the first number of symbols of the bitstream and changing the value of each of the selected first number of symbols comprises means for selecting the first number of symbols corresponding to the bitstream and changing the value of each of the selected first number of symbols such that a respective power level of each of the selected first number of symbols are decreased according to a mapping corresponding to a modulation scheme.

In Example 243, the subject matter of Example 242 includes, wherein a modulation scheme used in transmitting the bitstream is a quadrature amplitude modulation scheme and wherein the means for changing the value of each of the selected first number of symbols comprises means for changing the value from a first constellation symbol associated with a first amplitude to a second constellation symbol associated with a second amplitude, the second amplitude less than the first amplitude.

In Example 244, the subject matter of Examples 242-243 includes, wherein a modulation scheme used in transmitting the bitstream is an optical modulation scheme including power-based compression and wherein the means for selecting the first number of symbols of the bitstream and changing the value of each of the selected first number of symbols comprises: means for determining that the bitstream includes a sequence of a first number of a repeated consecutive values, the sequence associated with a first peak transmission power that is correlated with the first number of the repeated consecutive values; and means for changing a selected value in the first number of repeated consecutive values to a second value.

In Example 245, the subject matter of Examples 240-244 includes, wherein the means for selecting the first number of symbols of the bitstream comprises means for selecting ones of the first number of symbols of the bitstream that are mapped to constellation points that are less than a threshold distance from a constellation point that a preceding or successive symbol in the bitstream is mapped to; and wherein changing the value of each of the selected first number of symbols comprises means for changing the ones of the first number of symbols to symbols that exceed the threshold distance from constellation points that the preceding and successive symbols in the bitstream are mapped to.

In Example 246, the subject matter of Examples 240-245 includes, wherein the communication metric comprises a bit error rate of for previous communications on the channel; and wherein the means for increasing the average power level of the transmitter decreases the bit error rate of the communications on the channel.

In Example 247, the subject matter of Examples 240-246 includes, wherein the communication metric comprises a signal-to-noise ratio; and wherein the means for increasing the average power level of the transmitter increases the signal-to-noise ratio of a recipient device.

In Example 248, the subject matter of Examples 240-247 includes, wherein a symbol comprises one or more bits that are modulated onto a carrier wave.

In Example 249, the subject matter of Examples 240-248 includes, wherein values of the first number of symbols are corrected using an error correction code on a receiver.

In Example 250, the subject matter of Examples 240-249 includes, wherein symbols of the first number of symbols are characterized by respective amplitude and phase shifts and wherein the means for changing the value of each of the selected first number of symbols comprises means for changing one or more of the amplitude or phase of each of the selected first number of symbols.

In Example 251, the subject matter of Examples 240-250 includes, wherein symbols of the first number of symbols are sequences of one or more bits and wherein the means for changing the value of each of the selected first number of symbols comprises means for changing one or more bits of the selected first number of symbols.

In Example 252, the subject matter of Examples 240-251 includes, means for determining a target number of symbols to be changed; means for determining a target average power level increase based upon the target number of symbols to be changed; and wherein the means for increasing the average power level of a transmitter for transmission of the portion of the bitstream on the channel comprises means for increasing the average power level to the target average power level.

Example 253 is at least one machine-readable medium including instructions that, when executed by processing circuitry, cause the processing circuitry to perform operations to implement of any of Examples 1-252.

Example 254 is an apparatus comprising means to implement of any of Examples 1-252.

Example 255 is a system to implement of any of Examples 1-252.

Example 256 is a method to implement of any of Examples 1-252.

What is claimed is:

1. A device for transmitting data, the device comprising:
a processor;
a memory, storing instructions, which when executed by the processor, causes the processor to perform operations comprising:
receiving a bitstream for transmission;
determining a plurality of symbols based upon values in the bitstream, each symbol corresponding to one or more bits of the bitstream;
selecting two or more of a plurality of symbols corresponding to the bitstream such that a measure of spread of respective positions of the selected symbols meets a threshold;
intentionally introducing an error in the bitstream by changing values of each of the selected symbols to a different value chosen based upon an optimization goal that improves a communication metric relative to the communication metric prior to changing the values of each of the selected symbols; and
transmitting the plurality of symbols with the changed values over a communication network.

2. The device of claim 1, wherein the optimization goal includes a reduction in a peak to average power ratio of a transmission power over a period of time.

3. The device of claim 2, wherein the bitstream is transmitted according to a quadrature amplitude modulation scheme and wherein the changed value of each of the selected symbols comprises a value transmitted at a lower amplitude than an original value.

4. The device of claim 2, wherein the bitstream is transmitted using an optical modulation scheme including power-based compression and wherein the operations of selecting two or more of the plurality of symbols of the bitstream comprises selecting at least a portion of a sequence of a number of repeated values, the sequence associated with a peak transmission power that is positively correlated with the number of the repeated values.

5. The device of claim 1, wherein the optimization goal includes an error rate reduction.

6. The device of claim 1, wherein the measure of spread comprises a minimum distance between respective selected symbols.

7. The device of claim 1, wherein the measure of spread comprises an average distance between respective selected symbols.

8. The device of claim 1, wherein the measure of spread comprises a variance of the selected symbols in the bitstream.

9. The device of claim 1, wherein the plurality of symbols are characterized by respective amplitude and phase shifts and wherein the operations of changing the value of each of the selected symbols comprises changing one or more of the respective amplitudes or phase shifts of each of the selected symbols.

10. The device of claim 1, wherein the plurality of symbols are sequences of one or more bits and wherein the operations of changing the value of each of the selected symbols comprises changing one or more bits in respective ones of the sequences.

11. The device of claim 1, wherein an error correction code is applied to the bitstream prior to the changing of the values.

12. A method for transmitting data, the method comprising:
receiving a bitstream for transmission;
determining a plurality of symbols based upon values in the bitstream each symbol corresponding to one or more bits of the bitstream;
selecting two or more of a plurality of symbols corresponding to the bitstream such that a measure of spread of respective positions of the selected symbols meets a threshold;
intentionally introducing an error in the bitstream by changing values of each of the selected symbols to a different value chosen based upon an optimization goal that improves a communication metric relative to the communication metric prior to changing the values of each of the selected symbols; and
transmitting the plurality of symbols with the changed values over a communication network.

13. The method of claim 12, wherein the optimization goal includes a reduction in a peak to average power ratio of a transmission power over a period of time.

14. The method of claim 13, wherein the bitstream is transmitted according to a quadrature amplitude modulation scheme and wherein the changed value of each of the selected symbols comprises a value transmitted at a lower amplitude than an original value.

15. The method of claim 13, wherein the bitstream is transmitted using an optical modulation scheme including power-based compression and wherein selecting two or more of the plurality of symbols of the bitstream comprises selecting at least a portion of a sequence of a number of repeated values, the sequence associated with a peak transmission power that is positively correlated with the number of the repeated values.

16. The method of claim 12, wherein the optimization goal includes an error rate reduction.

17. The method of claim 12, wherein the measure of spread comprises a minimum distance between respective selected symbols.

18. The method of claim 12, wherein the measure of spread comprises an average distance between respective selected symbols.

19. A device for transmitting data, the device comprising:
means for receiving a bitstream for transmission;
means for determining a plurality of symbols based upon values in the bitstream, each symbol corresponding to one or more bits of the bitstream;
means for selecting two or more of a plurality of symbols corresponding to the bitstream such that a measure of spread of respective positions of the selected symbols meets a threshold;
means for intentionally introducing an error in the bitstream by changing values of each of the selected symbols to a different value chosen based upon an optimization goal that improves a communication metric relative to the communication metric prior to changing the values of each of the selected symbols; and
means for transmitting the plurality of symbols with the changed values over a communication network.

20. The device of claim 19, wherein the optimization goal includes a reduction in a peak to average power ratio of a transmission power over a period of time.

* * * * *